(12) United States Patent
Chang et al.

(10) Patent No.: US 12,506,079 B2
(45) Date of Patent: Dec. 23, 2025

(54) SEMICONDUCTOR DEVICE WITH BACKSIDE POWER RAIL AND METHODS OF FABRICATION THEREOF

(71) Applicant: TAIWAN SEMICONDUCTOR MANUFACTURING COMPANY, LTD., Hsinchu (TW)

(72) Inventors: Cheng-Wei Chang, Taipei (TW); Shahaji B. More, Hsinchu (TW); Yi-Ying Liu, Hsinchu (TW); Yueh-Ching Pai, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 631 days.

(21) Appl. No.: 17/870,786

(22) Filed: Jul. 21, 2022

(65) Prior Publication Data

US 2024/0030136 A1 Jan. 25, 2024

(51) Int. Cl.
*H01L 23/528* (2006.01)
*H01L 21/285* (2006.01)
*H01L 21/768* (2006.01)
(Continued)

(52) U.S. Cl.
CPC .... *H01L 23/5286* (2013.01); *H01L 21/76898* (2013.01); *H01L 23/5226* (2013.01); *H10D 30/6729* (2025.01); *H10D 62/151* (2025.01); *H01L 21/28518* (2013.01); *H01L 21/76805* (2013.01); *H01L 21/76843* (2013.01);
(Continued)

(58) Field of Classification Search
CPC .. H10D 64/017; H10D 64/256; H10D 64/254; H10D 64/62; H10D 30/6735; H10D 30/024; H10D 30/0213; H10D 30/6219; H10D 30/6729; H10D 30/014; H10D 30/031; H10D 30/43; H10D 30/6757; H10D 84/013; H10D 84/017; H10D 62/149; H10D 62/151; H10D 62/121; H01L 23/5286; H01L 23/53209; H01L 23/53223; H01L 23/53238; H01L 23/53252; H01L 23/53266; H01L 21/76898; H01L 21/5226; H01L 21/28518; H01L 21/76805;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Julio J Maldonado
*Assistant Examiner* — Nathan Pridemore
(74) *Attorney, Agent, or Firm* — NZ Carr Law Office

(57) ABSTRACT

A semiconductor device structure is provided. The semiconductor device structure includes a substrate having a first side and a second side opposing the first side, a source/drain epitaxial feature disposed adjacent the first side of the substrate, wherein the source/drain epitaxial feature comprises a first epitaxial layer, a second epitaxial layer in contact with the first epitaxial layer, and a third epitaxial layer having sidewalls surrounded by and in contact with the second epitaxial layer. The device structure also includes a first silicide layer in contact with the substrate, the first, second, and third epitaxial layers, a first source/drain contact extending through the substrate from the first side to the second side, and a first metal capping layer disposed between the first silicide layer and the first source/drain contact.

20 Claims, 27 Drawing Sheets

(51) Int. Cl.
*H01L 23/522* (2006.01)
*H01L 23/532* (2006.01)
*H10D 30/01* (2025.01)
*H10D 30/67* (2025.01)
*H10D 62/13* (2025.01)
*H10D 64/01* (2025.01)
*H10D 64/62* (2025.01)

(52) U.S. Cl.
CPC .. *H01L 23/53209* (2013.01); *H01L 23/53223* (2013.01); *H01L 23/53238* (2013.01); *H01L 23/53252* (2013.01); *H01L 23/53266* (2013.01); *H10D 30/014* (2025.01); *H10D 30/031* (2025.01); *H10D 30/6735* (2025.01); *H10D 64/017* (2025.01); *H10D 64/62* (2025.01)

(58) Field of Classification Search
CPC ......... H01L 21/76843; H01L 21/28562; H01L 21/76897; H01L 21/76855
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,355,611 B2 | 6/2022 | Ching et al. | |
| 2003/0207523 A1* | 11/2003 | Liu | H10D 84/907 438/200 |
| 2020/0168735 A1* | 5/2020 | Yu | H10D 84/834 |
| 2021/0050427 A1 | 2/2021 | Ching et al. | |
| 2021/0159326 A1* | 5/2021 | Hsiao | H01L 21/76877 |
| 2021/0408246 A1* | 12/2021 | Ganguly | H01L 21/02532 |
| 2022/0130961 A1 | 4/2022 | Wu et al. | |

* cited by examiner

SEMICONDUCTOR DEVICE WITH BACKSIDE POWER RAIL AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
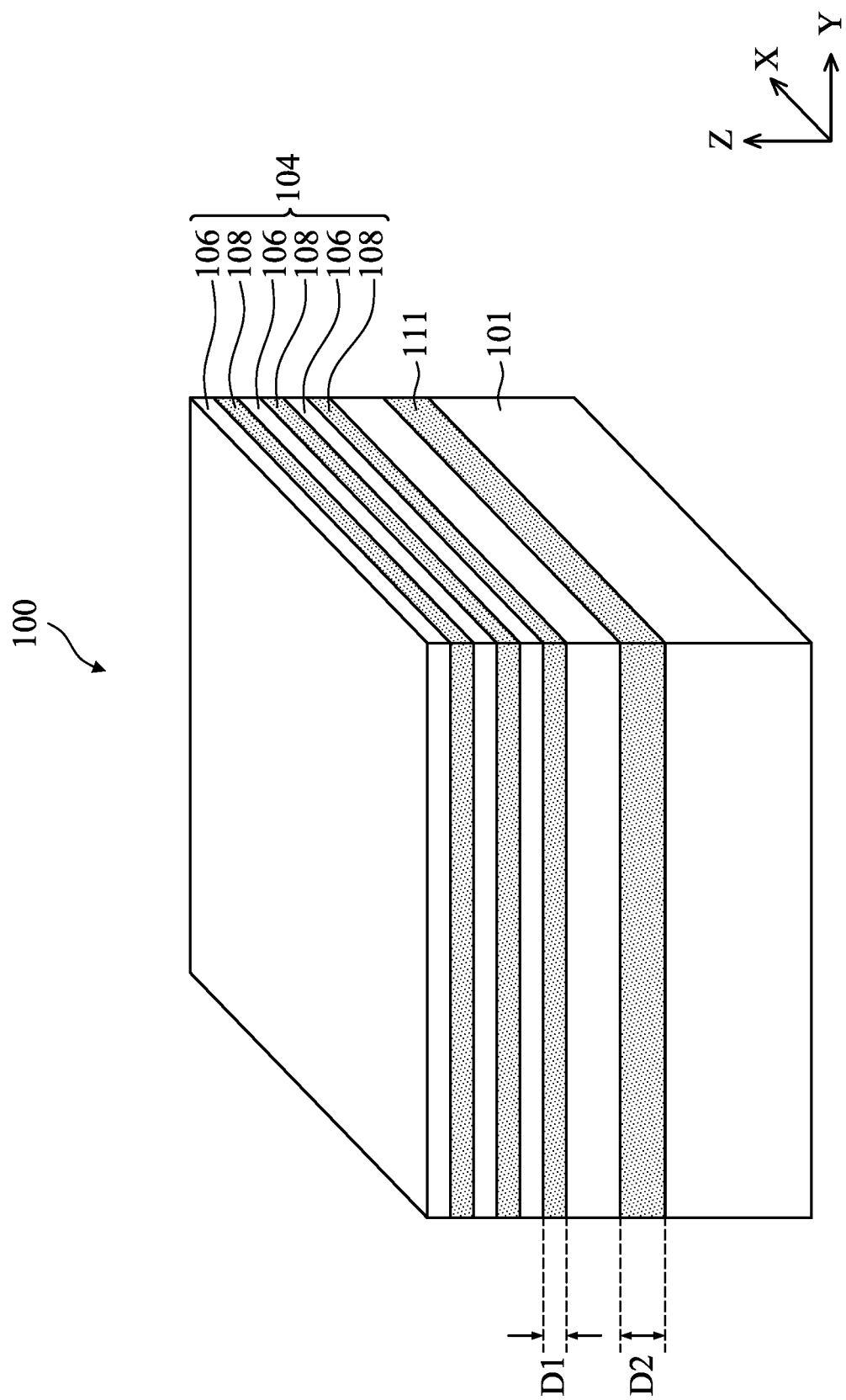
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-27 show exemplary processes for manufacturing a semiconductor device structure 100 according to embodiments of the present disclosure. It is understood that additional operations can be provided before, during, and after processes shown by FIGS. 1-27, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100 in accordance with some embodiments. As shown in FIG. 1, the semiconductor device structure 100 includes a stack of semiconductor layers 104 formed over a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanosheet channels in a multi-gate device, such as nanosheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. In any case, the second semiconductor layers 108 may have a Ge concentration in a range between about 20% and 30%.

The thickness of the first semiconductor layers 106 and the second semiconductor layers 108 may vary depending on the application and/or device performance considerations. In some embodiments, each first and second semiconductor layer 106, 108 may have a thickness in a range between about 5 nm and about 30 nm. Each second semiconductor layer 108 may have a thickness that is equal to, less than, or greater than the thickness of the first semiconductor layer 106. In some embodiments, each first semiconductor layer 106 has a thickness in a range between about 10 nm and about 30 nm, and each second semiconductor layer 108 has a thickness in a range between about 5 nm to about 20 nm. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8.

The semiconductor device structure 100 further includes a sacrificial layer 111 disposed below the stack of semiconductor layers 104. In some embodiments, the sacrificial layer 111 is disposed in the substrate 101 at an elevation about 40 nm to about 80 nm below the bottommost second semiconductor layer 108 of the stack of semiconductor layers 104. The sacrificial layer 111 serves as a planarization termination layer during the backside planarization process to prevent the planarization process from removing or damaging subsequently formed source/drain features 146 (see FIG. 12). The material of the sacrificial layer 111 is chosen such that it has a different etch selectivity and/or oxidation rates with respect to the material (e.g., silicon) of the substrate 101. In various embodiments, the sacrificial layer 111 is a silicon germanium (SiGe) layer. The SiGe layer may be a non-graded SiGe layer. In some embodiments, the sacrificial layer 111 is a graded SiGe layer where a germanium concentration varies in a range between about 20% and 30% with the distance away from the interface of the bottommost second semiconductor layer 108 and the substrate 101. The sacrificial layer 111 may have a thickness greater than the thickness of the second semiconductor layer 108. In some embodiments, the sacrificial layer 111 may have a thickness in a range between about 5 nm and about 20 nm. The sacrificial layer 111 may be deposited using the same deposition technique as the second semiconductor layer 108.

Figure 2:
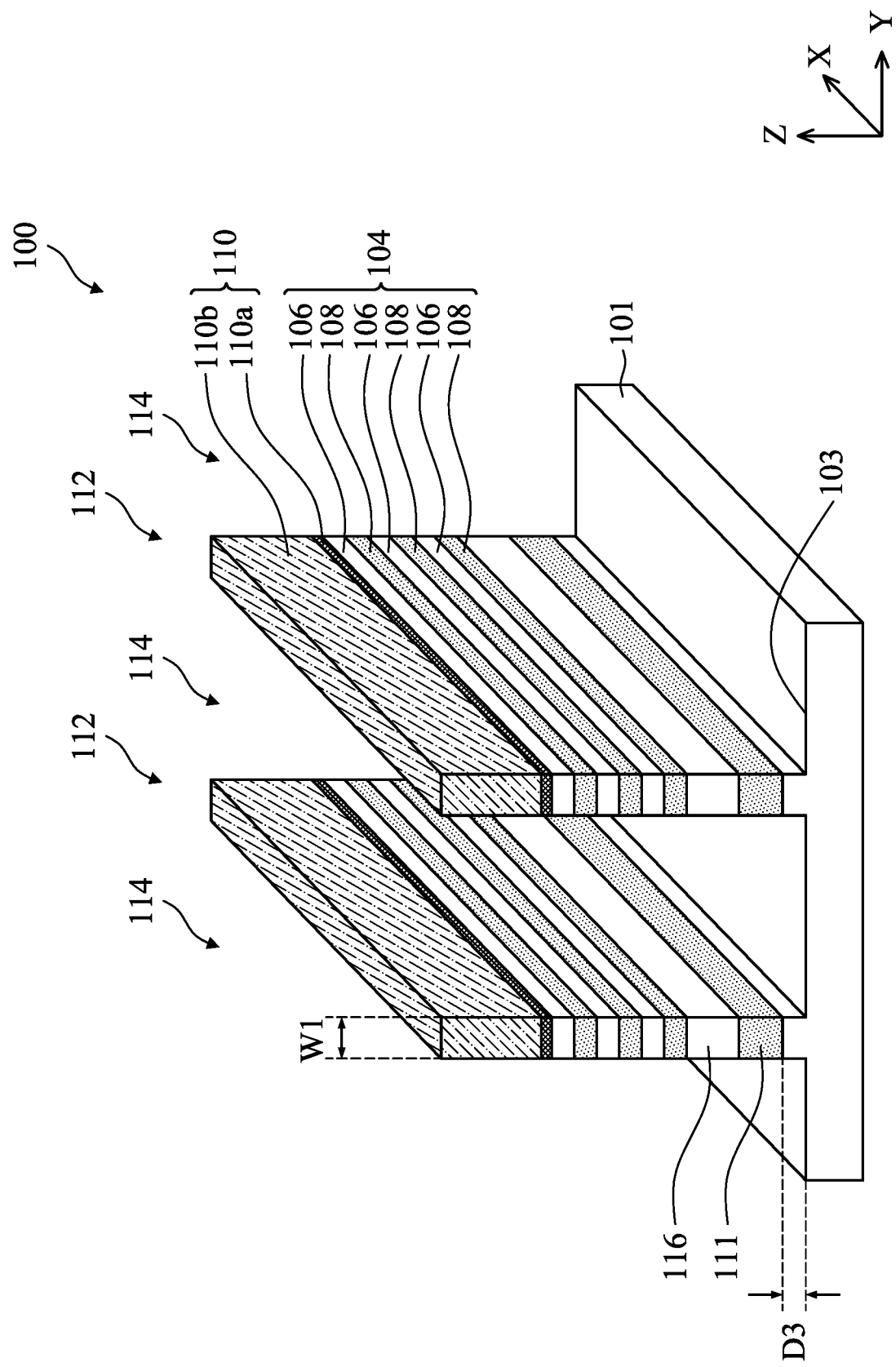

In FIG. 2, fin structures 112 are formed from the stack of semiconductor layers 104 and the sacrificial layer 111. Each fin structure 112 has a portion including the semiconductor layers 106, 108, the sacrificial layer 111, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer. The hard mask 110b may be a nitrogen-containing layer, such as a $Si_3N_4$ layer. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the photoresist layer to a pattern, performing post-exposure bake processes, and developing the photoresist layer to form a patterned photoresist layer. The patterned photoresist layer may then be used to protect regions of the substrate 101 and layers formed thereupon, while an etch process forms trenches 114 in unprotected regions through the mask structure 110, the stack of semiconductor layers 104, the sacrificial layer 111 and into the substrate 101, thereby forming the extending fin structures 112. In some embodiments, the etch process is performed such that the bottom 103 of the trenches 114 is at a distance D3 about 20 nm to about 40 nm below the sacrificial layer 111. A width W1 of the fin structures 112 along the Y direction may be in a range between about 3 nm and about 44 nm. The trenches 114 may be etched using a dry etch (e.g., RIE), a wet etch, and/or combination thereof. While two fin structures 112 are shown, the number of the fin structures is not limited to two.

Figure 3:
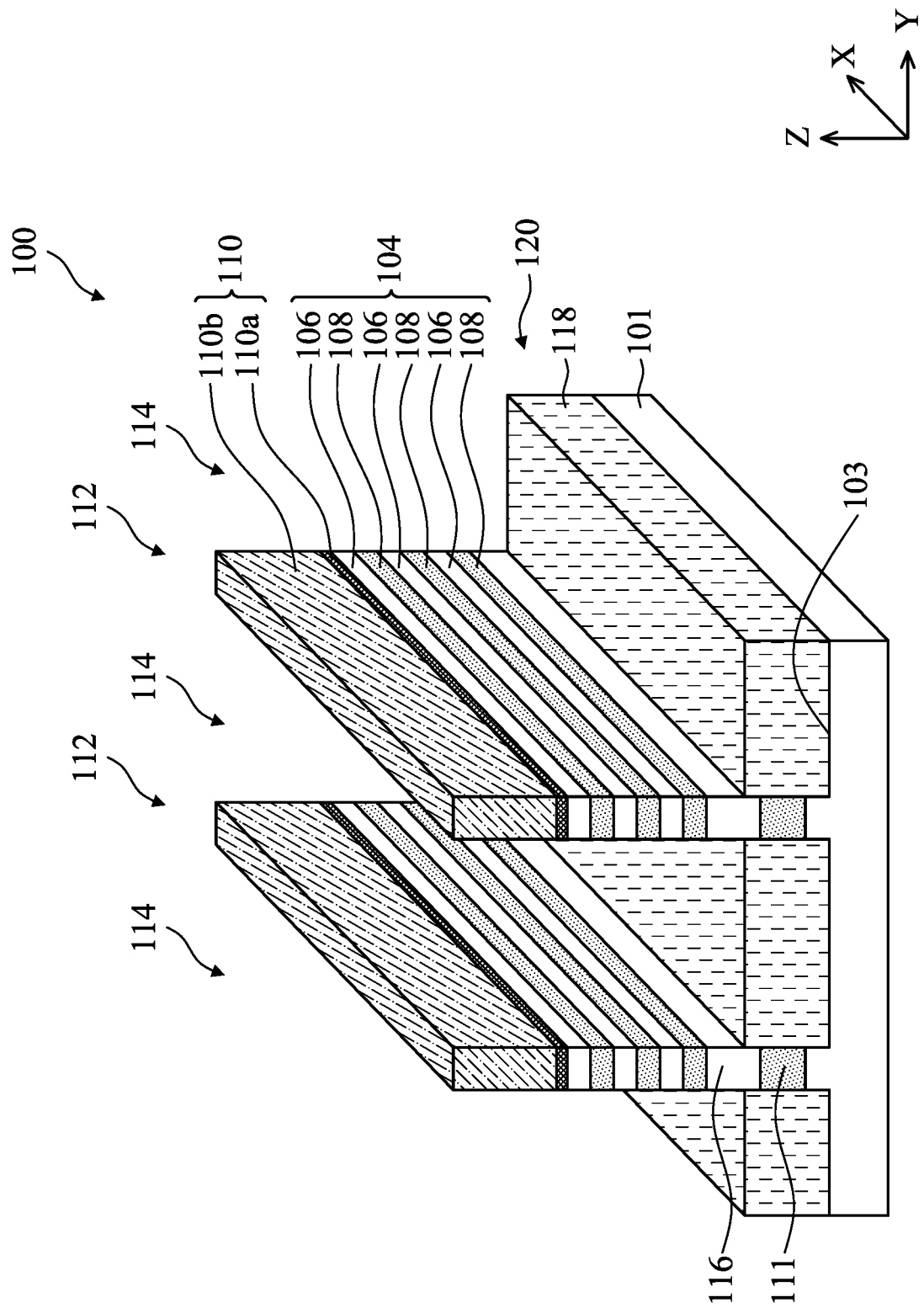

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. As a result of the recess process, a top surface of the insulating material 118 may be between the top surface of the sacrificial layer 111 and a surface of the second semiconductor layer 108 in contact with the well portion 116.

Figure 4:
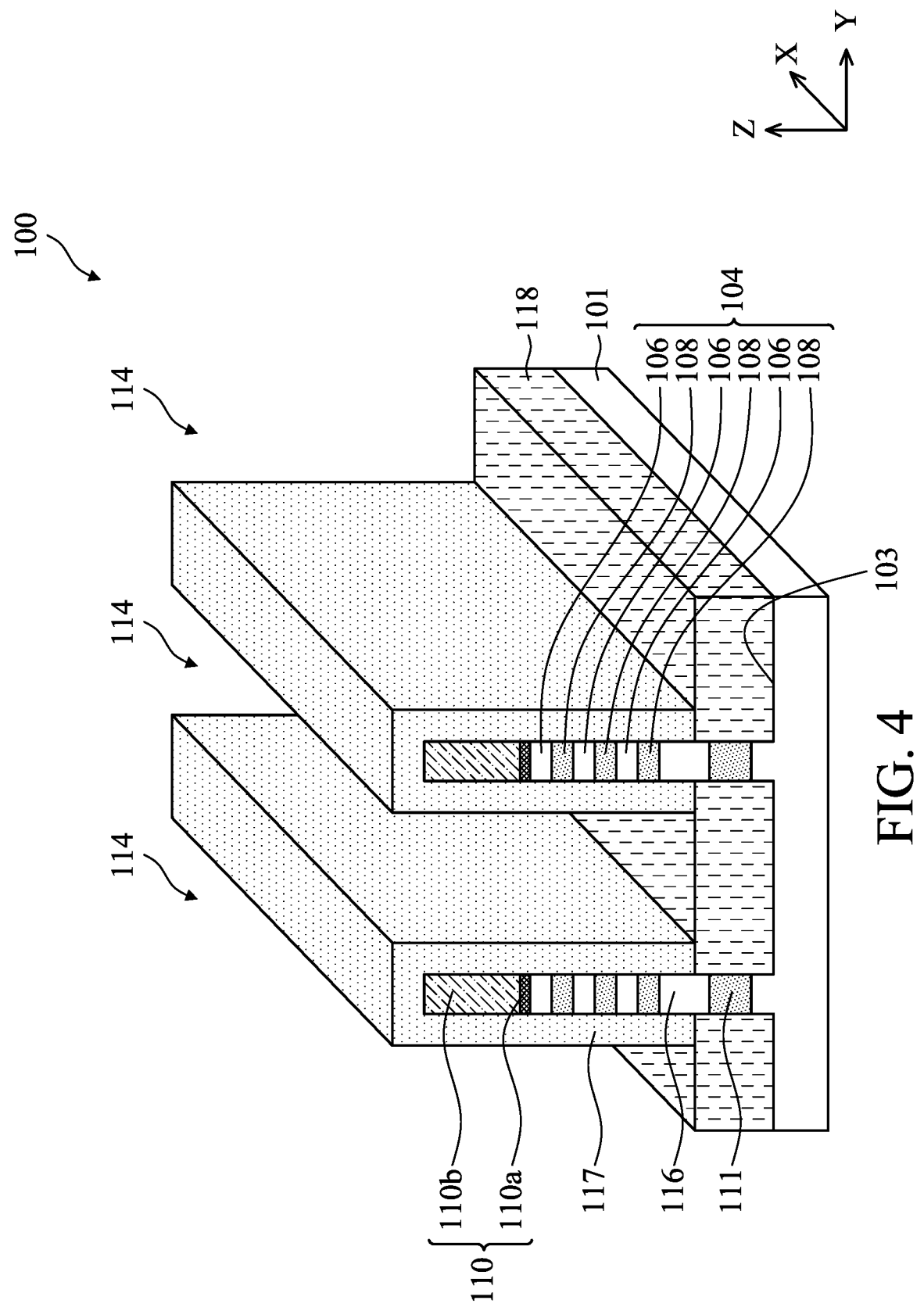

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the subsequently formed gate electrode layer.

Figure 5:
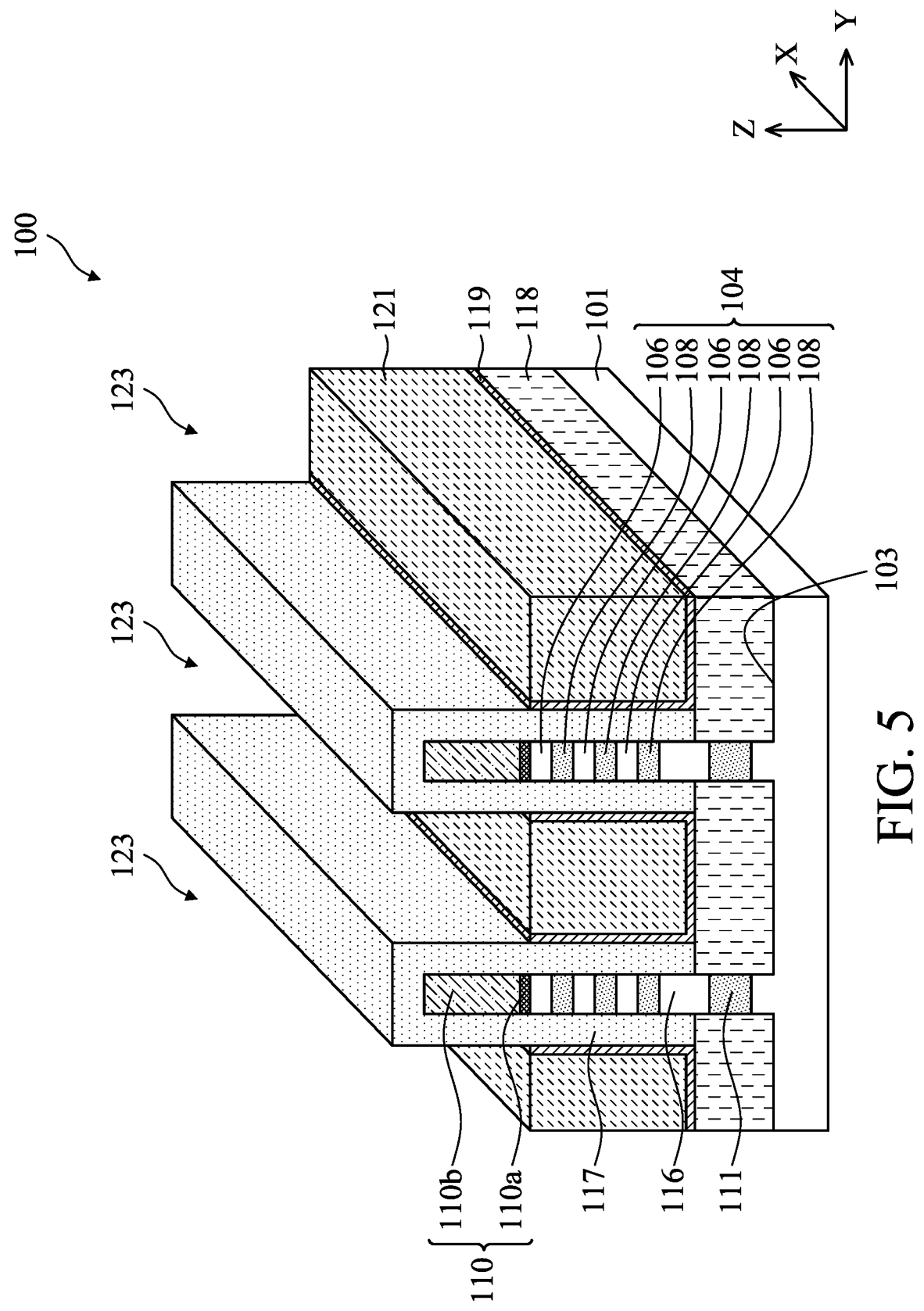

In FIG. 5, a liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer 106. For example, in some embodiments, after the recess process, the top surfaces of the liner 119 and the dielectric material 121 may be level with a top surface of the uppermost first semiconductor layer 106. The recess processes may be selective etch processes that do not substantially affect the semiconductor material of the cladding layer 117. As a result of the recess process, trenches 123 are formed between the fin structures 112.

Figure 6:
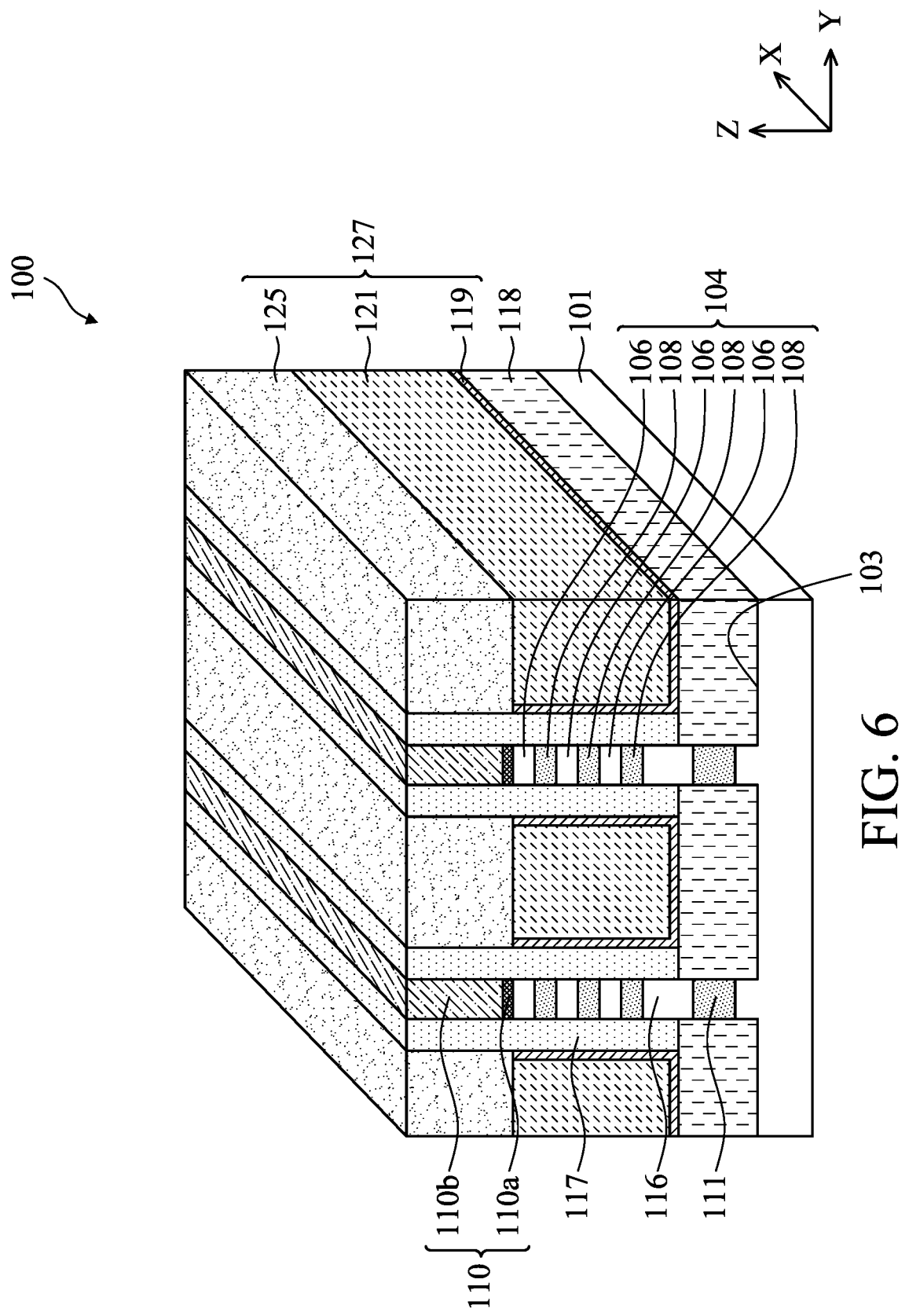

In FIG. 6, a dielectric material 125 is formed in the trenches 123 (FIG. 5) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequent formed source/drain (S/D) epitaxial features and adjacent gate electrode layers.

Figure 7:
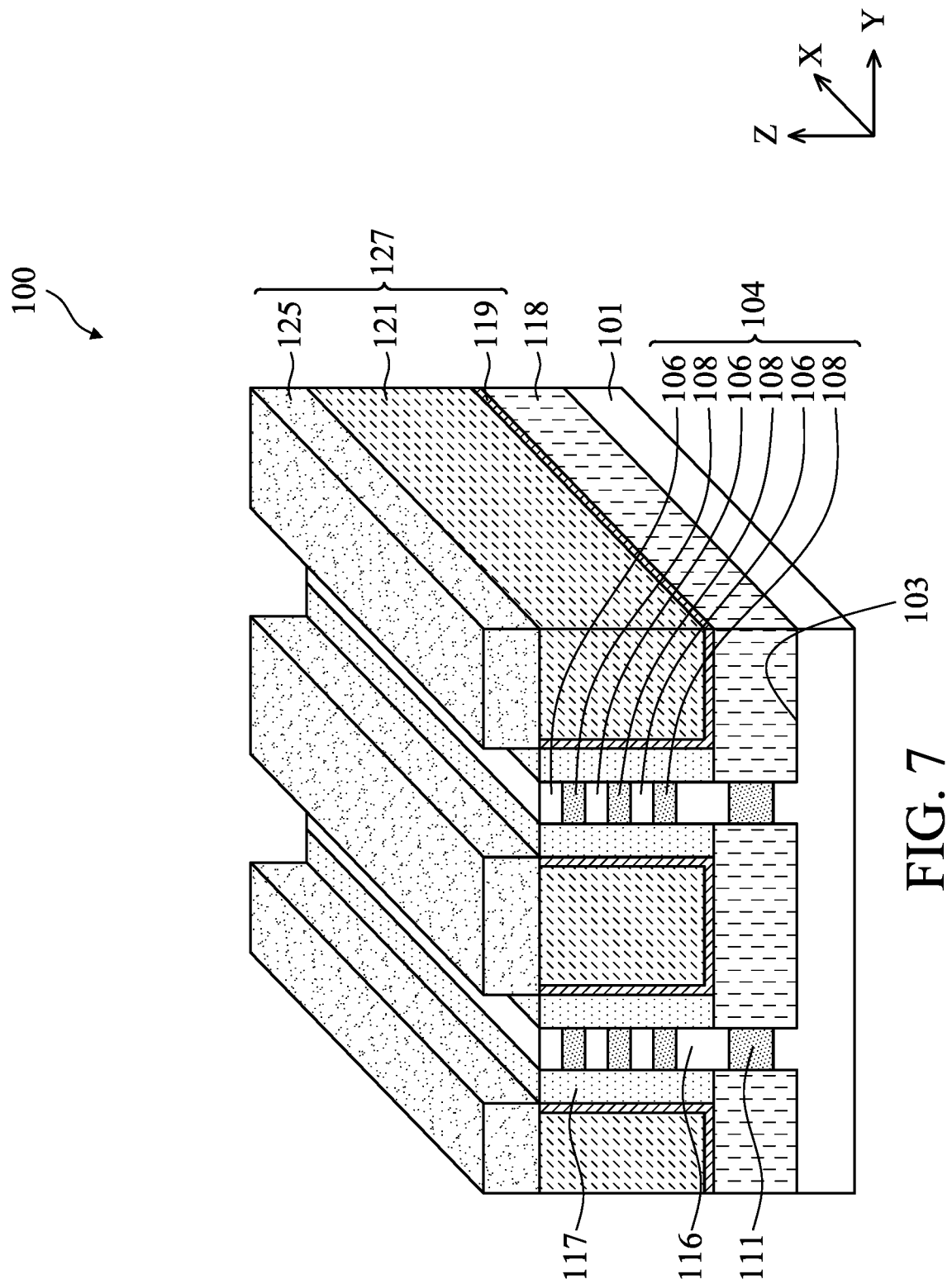

In FIG. 7, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the uppermost first semiconductor layer 106 in the stack of semiconductor layers 104. The etch process may be a selective etch process that does not substantially affect the dielectric material 125. The removal of the mask structures 110 may be performed by any suitable process, such as dry etch, wet etch, or a combination thereof.

Figure 8:
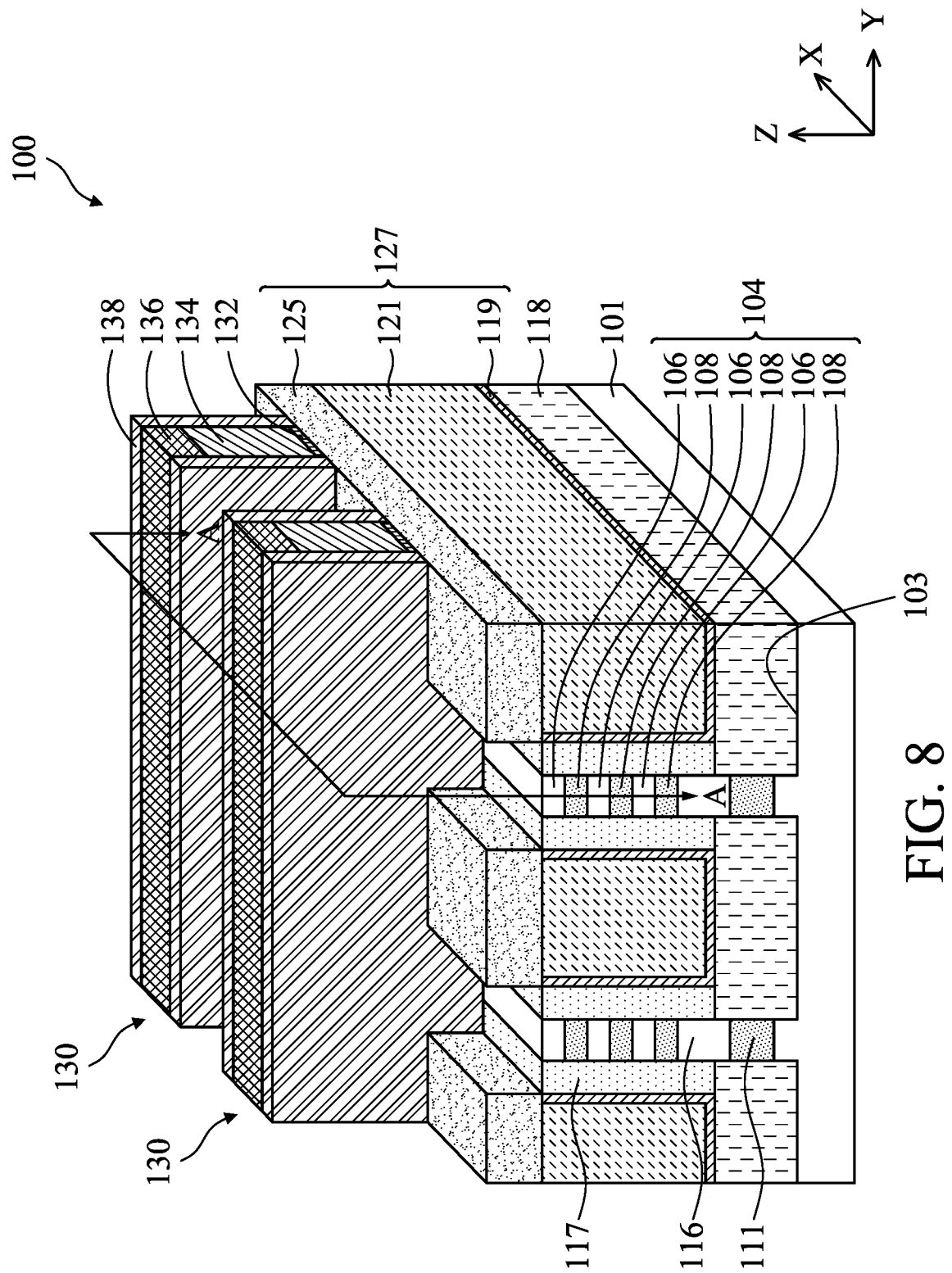

In FIG. 8, one or more sacrificial gate structures 130 (only two is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While two sacrificial gate structures 130 are shown, three or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

In some embodiments where the cladding layers 117 and the dielectric features 127 are not present, portions of the sacrificial gate structures 130 and the gate spacers 138 are formed on the insulating material 118, and gaps are formed between exposed portions of the fin structures 112.

Figure 9:
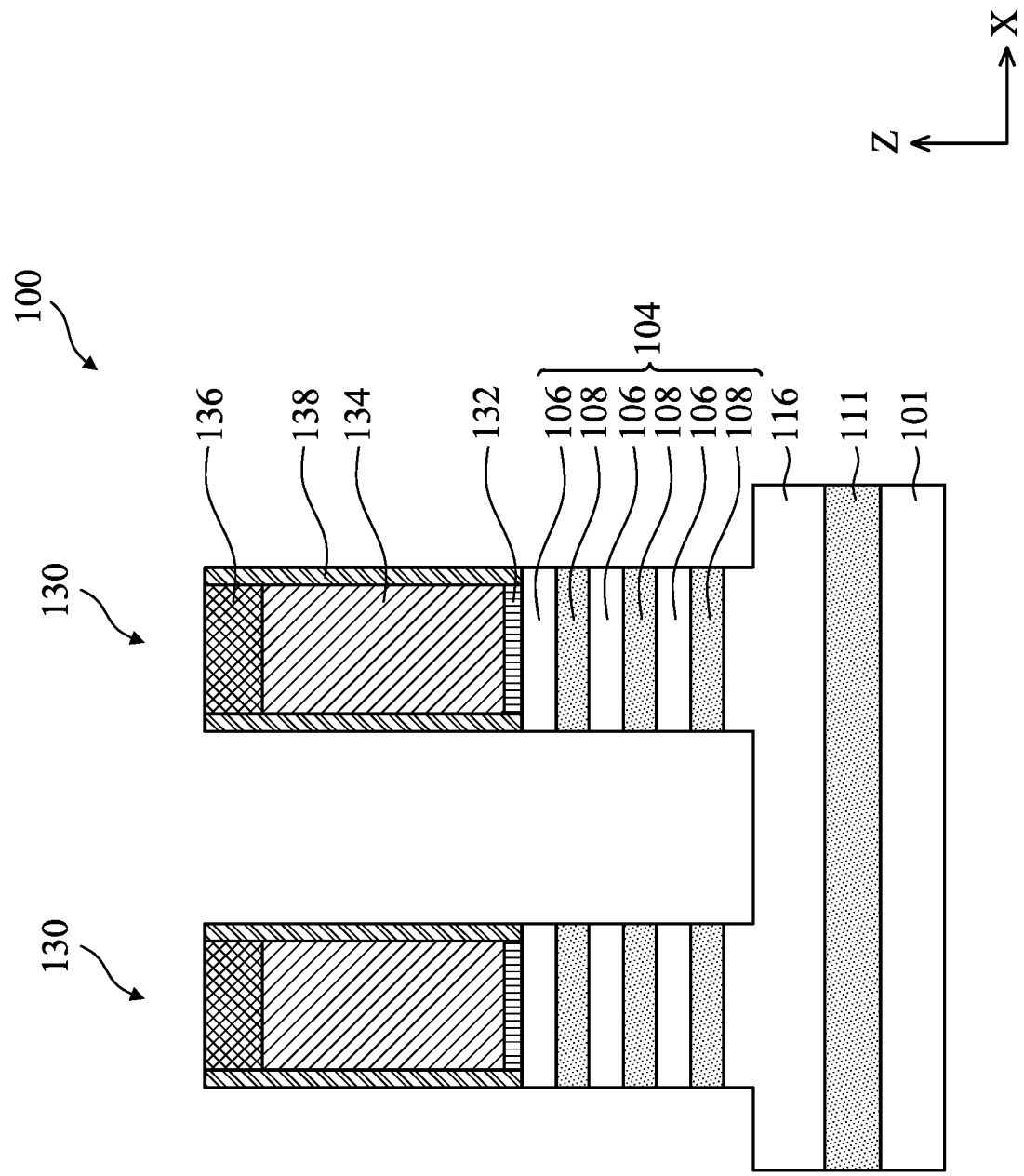
FIGS. 9-27 are cross-sectional side views of various stages of manufacturing the semiconductor device structure taken along cross-section A-A of FIG. 8, in accordance with some embodiments.

FIGS. 9-27 are cross-sectional side views of various stages of manufacturing the semiconductor device structure 100 taken along cross-section A-A of FIG. 8, in accordance with some embodiments. Cross-section A-A is in a plane of the fin structure 112 along the X direction. In FIG. 9, exposed portions of the fin structures 112, exposed portions of the cladding layers 117, and a portion of the exposed dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

Figure 10:
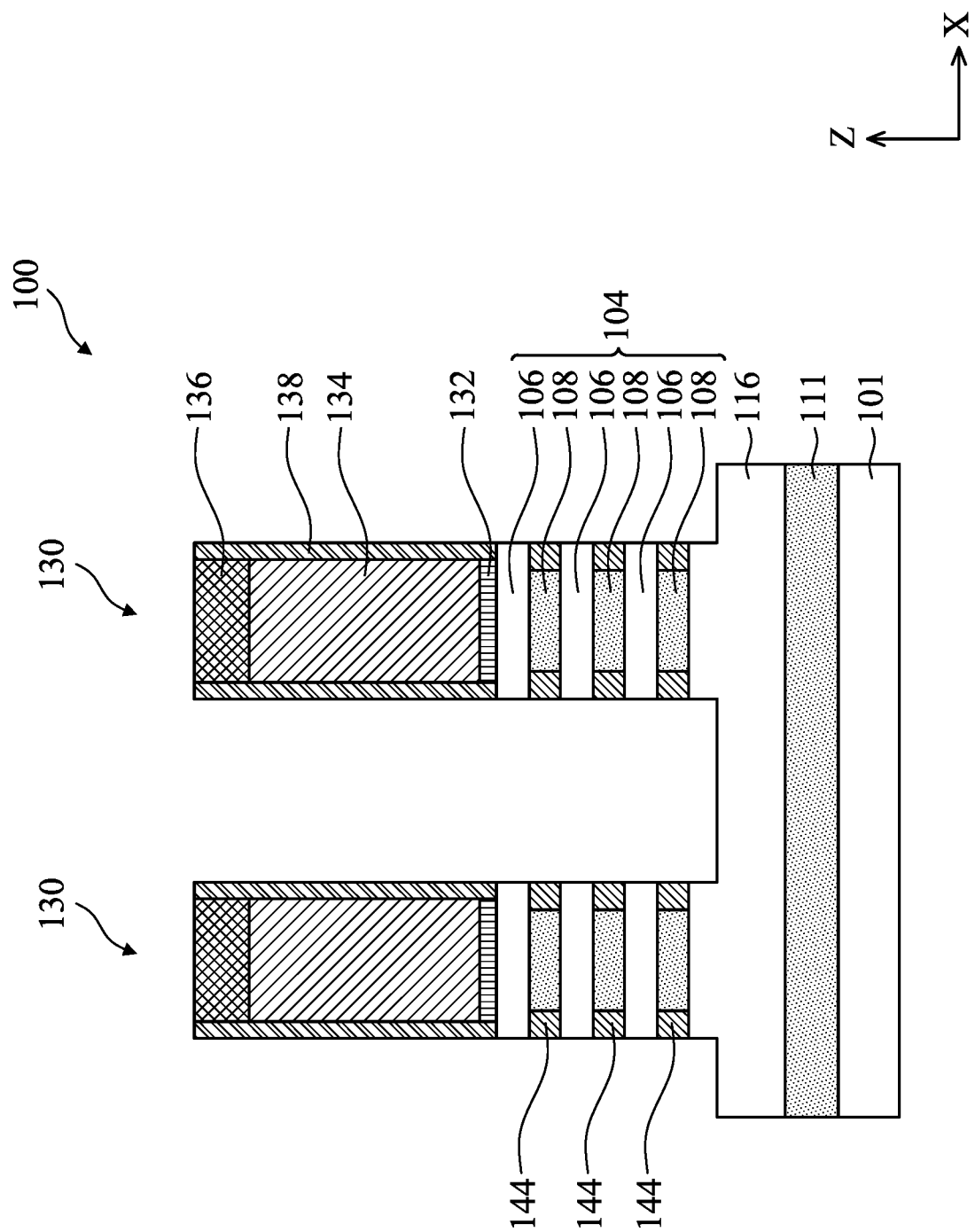

In FIG. 10, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 11:
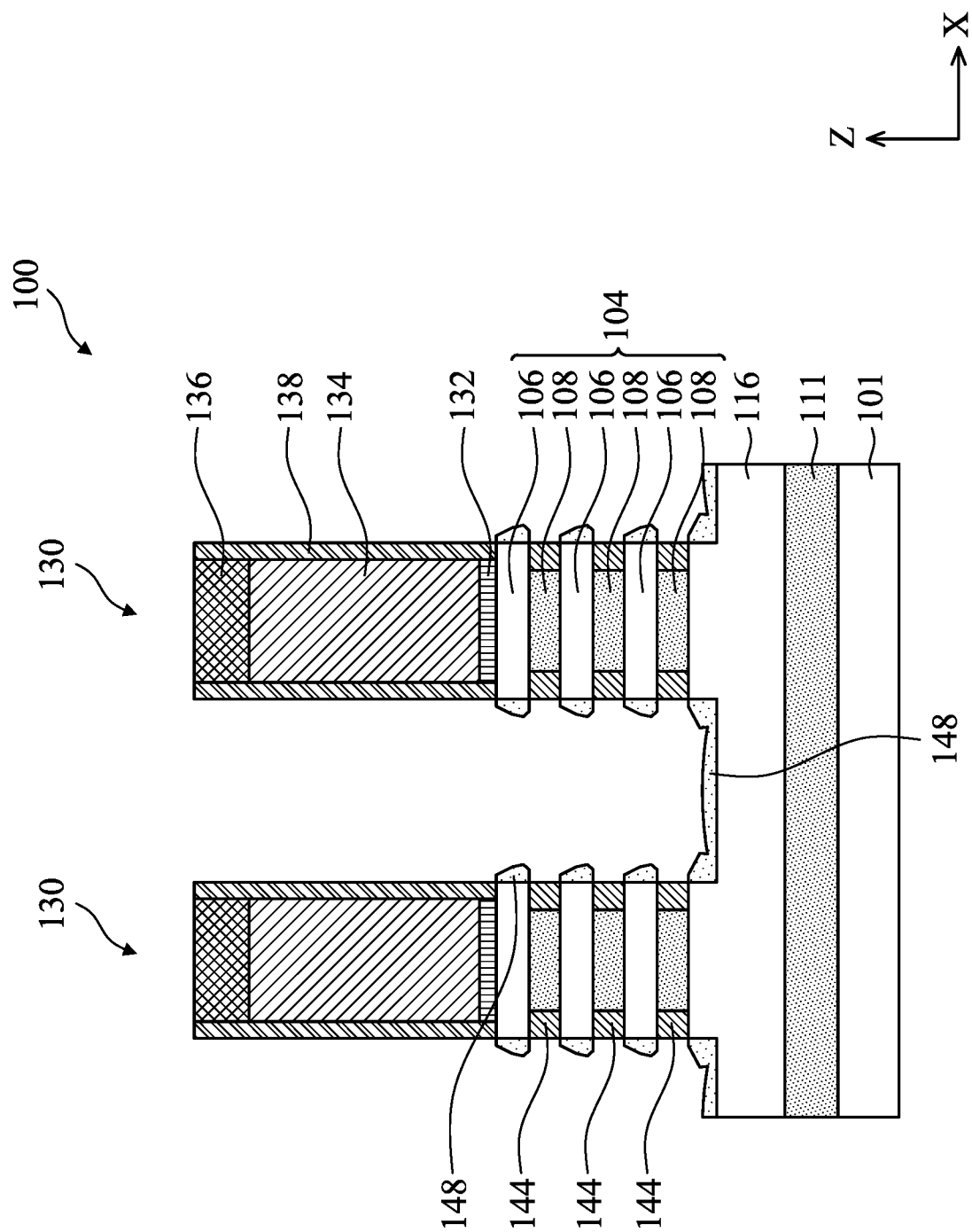

In FIG. 11, after formation of the dielectric spacers 144, a facetted structure 148 is formed on exposed surfaces of the first semiconductor layers 106 and exposed surfaces (e.g., well portion 116) of the substrate 101 to promote epitaxial growth of subsequent S/D features 146. In some embodiments, a portion of the facetted structure 148 is further in contact with the dielectric spacer 144. The facetted structures 148 may grow both vertically and horizontally to form facets, which may correspond to crystal planes of the material of the first semiconductor layers 106 and exposed surfaces of the substrate 101. Due to different growth rates on different surface planes, facets can be formed. For example, during the growth of the facetted structures 148, the growth rate on (111) planes of the first semiconductor layer 106 (e.g., silicon) may be lower than the growth rate on other planes, such as (110) and (100) planes of the first semiconductor layer 106. Therefore, facets are formed as a result of difference in growth rates of the different planes. In one embodiment, the facetted structures 148 have a rhombus-like shape. Comparing to the exposed surfaces of the first semiconductor layer 106, the facets of the facetted structures 148 provide increased surface area to promote epitaxial growth of the S/D features 146. Once the facetted structures 148 are formed, the S/D features 146 may grow on the facetted structures 148 and cover the exposed surfaces of the facetted structures 148.

In some embodiments, the facetted structures 148 include silicon. In some embodiments, the facetted structures 148 include silicon and n-type or p-type dopants, depending on the conductivity type of the S/D features 146 to be grown thereon. For example, the facetted structure 148 at a n-type device region may be silicon doped with n-type dopants, such as phosphorous or arsenic, and the facetted structure 148 at a p-type device region may be silicon doped with p-type dopants, such as boron. The facet structures 148 may be formed using selective epitaxial growth (SEG), ALD, MBE, or any suitable growth process. In some embodiments, the first semiconductor layers 106 may be exposed to silicon-containing precursor(s) and n-type or p-type dopant-containing precursor(s) in a process chamber to form facetted structure 148. The process conditions of the growth process are configured in accordance with the crystal planes of the first semiconductor layer 106 and the substrate 101 to promote faceting formation of the facetted structures 148. Once the predetermined volume of the facetted structures 148 is reached, the flow of the n-type or p-type dopant-containing precursor(s) may be terminated and group IV or group V precursor(s) are introduced into the process chamber along with the silicon-containing precursor(S) to form the S/D features 146. Therefore, the facetted structures 148 are formed of a material that is chemically different from that of the S/D features 146. The dopants in the S/D features 146 may be added during the formation of the S/D features 146, or after the formation of the S/D features 146 by an implantation process.

Figure 12:
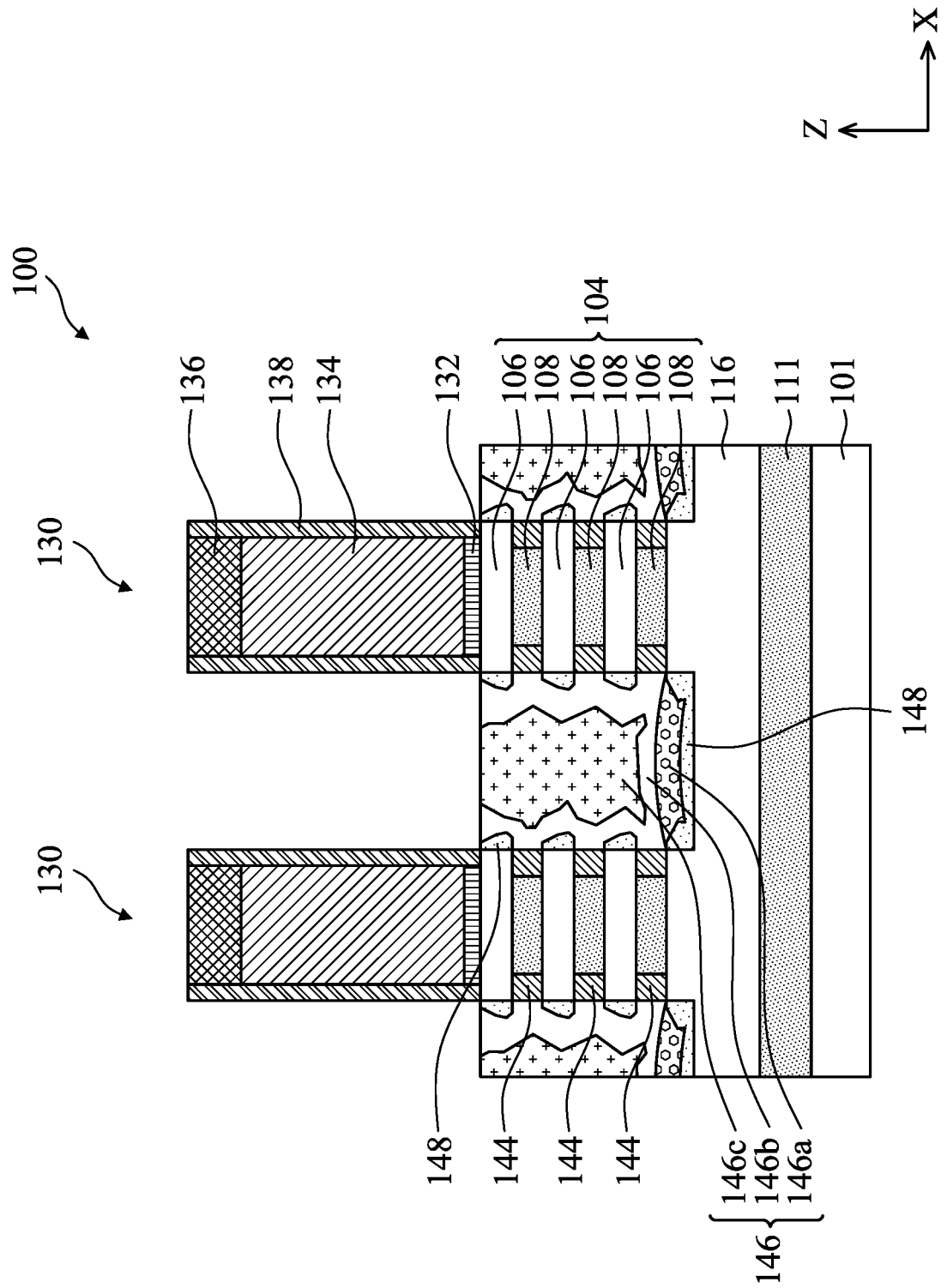

In FIG. 12, S/D epitaxial features 146 are formed in the S/D regions between the neighboring sacrificial gate structures 130. The shape of the S/D epitaxial features 146 is confined by the dielectric feature 127. The S/D epitaxial features 146 may include a first epitaxial layer 146a, a second epitaxial layer 146b formed on the first epitaxial layer 146a, and a third epitaxial layer 146c formed on the second epitaxial layer 146b. The first, second, and third epitaxial layers 146a, 146b, 146c may be formed by any suitable process, such as cyclic deposition etch (CDE) epitaxy process, selective etch growth (SEG) process, ALD, molecular beam epitaxy (MBE), or any combination thereof.

The S/D epitaxial features 146 may be the S/D regions. For example, one of a pair of S/D epitaxial features 146 located on one side of the sacrificial gate structures 130 may be a source region, and the other of the pair of S/D epitaxial features 146 located on the other side of the sacrificial gate structures 130 may be a drain region. A pair of S/D epitaxial features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

The first epitaxial layer 146a is formed on the facetted structures 148 that is disposed on the exposed surfaces of the well portion 116 of the substrate 101. In some embodiments, a portion of the first epitaxial layer 146a is further in contact with the dielectric spacers 144. The first epitaxial layer 146a may include a semiconductor material, such as Si, SiP, SiC, SiAs, SiCP SiGe, or Ge. In some embodiments, the first epitaxial layer 146a is formed of undoped silicon. In some embodiments, the first epitaxial layer 146a is formed of undoped silicon germanium. That is, the first epitaxial layer 146a does not include a dopant. The first epitaxial layer 146a having no dopant avoids possible dopant diffusion into the channel regions (e.g., the region of the substrate 101 located below the sacrificial gate structures 130 and between adjacent epitaxial S/D features 146).

The second epitaxial layer 146b is conformally formed on the first epitaxial layer 146a and in contact with the dielectric spacers 144 and the facetted structures 148. In some embodiments, the second epitaxial layer 146b is formed to cover entirely the exposed surfaces of the dielectric spacers 144 and the facetted structures 148. In some embodiments, the second epitaxial layer 146b include the same material as the first epitaxial layer 146a with a higher dopant concentration. In some embodiments, the second epitaxial layer 146b is formed of silicon germanium, and the Ge concentration is in a range between about 25% and 40%. Depending on the conductivity type of the device to be formed on the fins 112, the second epitaxial layer 146b may have n-type dopants or p-type dopants. The second epitaxial layer 146b serves as a leakage barrier layer to prevent possible diffusion of subsequent backside metallic elements into the gate area. The second epitaxial layer 146b may also function as lattice transitional layer between the first epitaxial layer 146a and the third epitaxial layer 146c. In some embodiments, the second epitaxial layer 146b is a boron-rich layer. In such cases, the second epitaxial layer 146b contains boron and the dopant concentration is in a range between about 1E20 atoms/cm$^3$ and about 8E20 atoms/cm$^3$. In some embodiments, the second epitaxial layer 146b contains phosphorus and the dopant concentration is in a range between about 1E20 atoms/cm$^3$ and about 5E20 atoms/cm$^3$. The second epitaxial layer 146b may have a thickness along the Z-direction in a range between about 3 nm and about 20 nm. If the thickness of the second epitaxial layer 146b is below 3 nm, the second epitaxial layer 146b may not be thick enough to function as the leakage barrier layer nor the lattice transitional layer between the first epitaxial layer 146a and the third epitaxial layer 146c to be formed. If the thickness of second epitaxial layer 146b is greater than 20 nm, the manufacturing cost is increased without obvious additional advantages for crystalline structural transition.

The third epitaxial layer 146c is formed on the second epitaxial layer 146b and having at least sidewalls surrounded by the second epitaxial layer 146b. In some embodiments, at least three surfaces of the third epitaxial layer 146c are in contact with the second epitaxial layer 146b. The third epitaxial layer 146c forms a major portion of the epitaxial S/D feature 146. Similarly, the third epitaxial layer 146c may be a semiconductor material, such as Si, SiP, SiC, SiAs, SiCP, SiGe, or Ge. In some embodiments, the third epitaxial layer 146c include the same material as the second epitaxial layer 146b. In some embodiments, the third epitaxial layer 146c is formed of silicon germanium, and the Ge concentration is in a range between about 50% and 60%. Depending on the conductivity type of the device to be formed on the fins 112, the third epitaxial layer 146c may have n-type dopants or p-type dopants. In either case, the third epitaxial layer 146c has a dopant concentration higher than the dopant concentration of the second epitaxial layer 146b. The higher dopant concentration of the third epitaxial layer 146c can reduce contact resistance for the epitaxial S/D features 146 and provide better conductivity with the subsequently formed source/drain metal contact (e.g., front side source/drain contact 186 in FIG. 20). In some embodiments, the second epitaxial layer 146b contains boron and the dopant concentration is in a range between about 8E20 atoms/cm$^3$ and about 3E21 atoms/cm$^3$. In some embodiments, the second epitaxial layer 146b contains phosphorus and the dopant concentration is in a range between about 5E20 atoms/cm$^3$ and about 4E21 atoms/cm$^3$.

Figure 13:
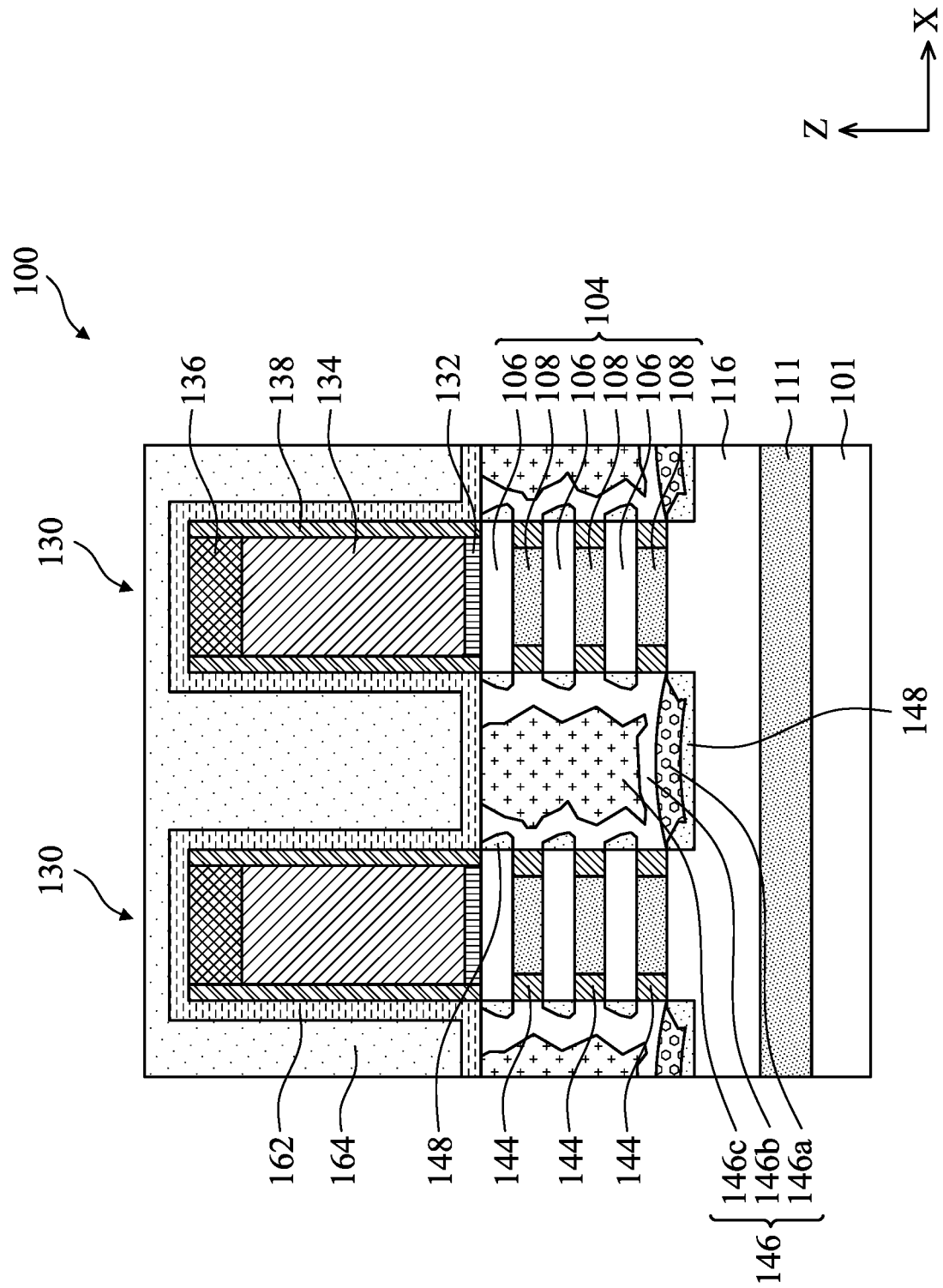

In FIG. 13, after formation of the S/D epitaxial features 146, a contact etch stop layer (CESL) 162 is conformally formed on the exposed surfaces of the semiconductor device structure 100. The CESL 162 covers the exposed surfaces of the S/D epitaxial features 146 and the sacrificial gate structures 130 (e.g., mask layer 136). The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 14:
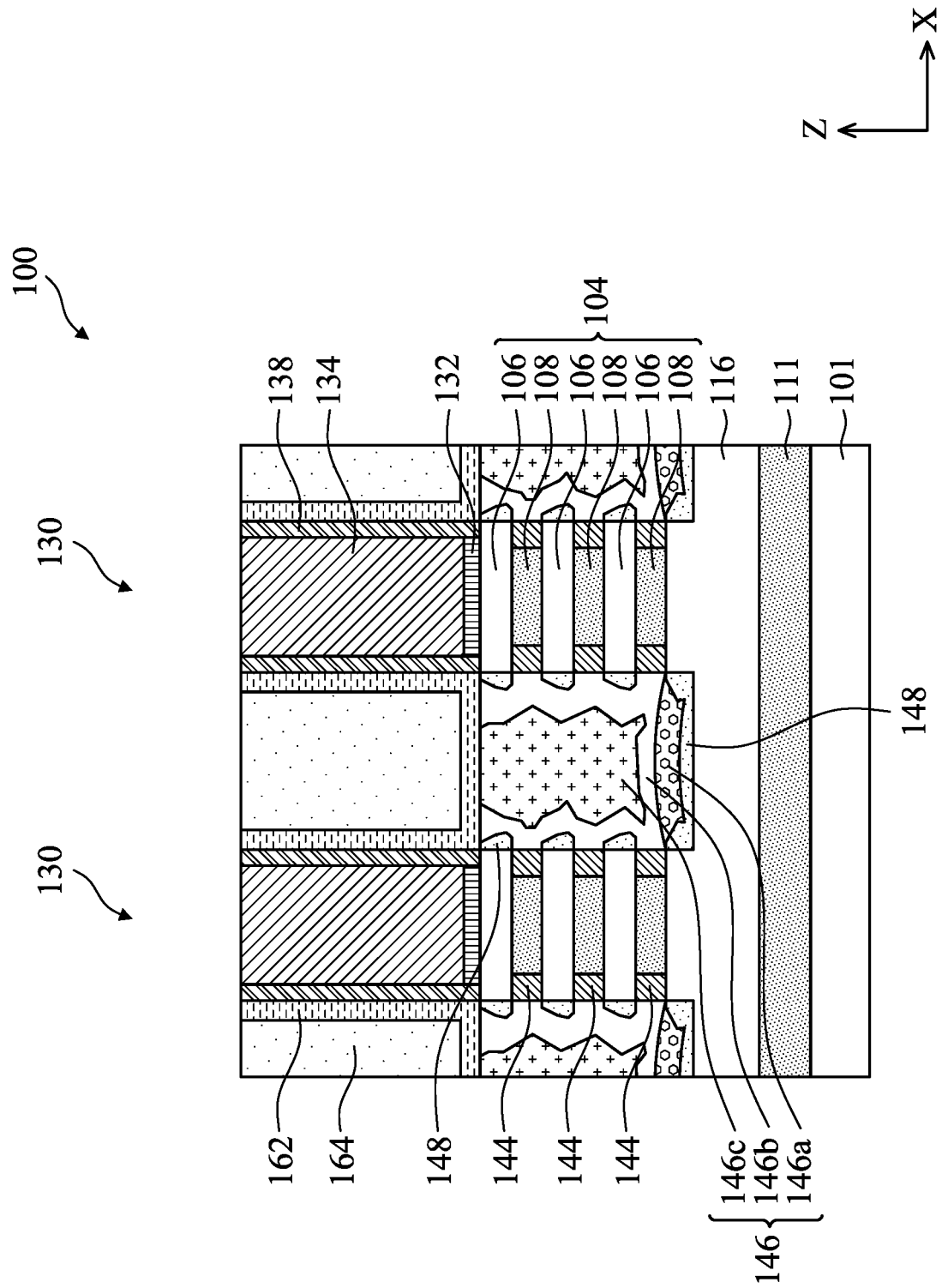

In FIG. 14, a planarization operation, such as CMP, is performed on the semiconductor device structure 100 to remove portions of the first ILD layer 164, the CESL 162, and the mask layer 136 until the sacrificial gate electrode layer 134 is exposed.

Figure 15:
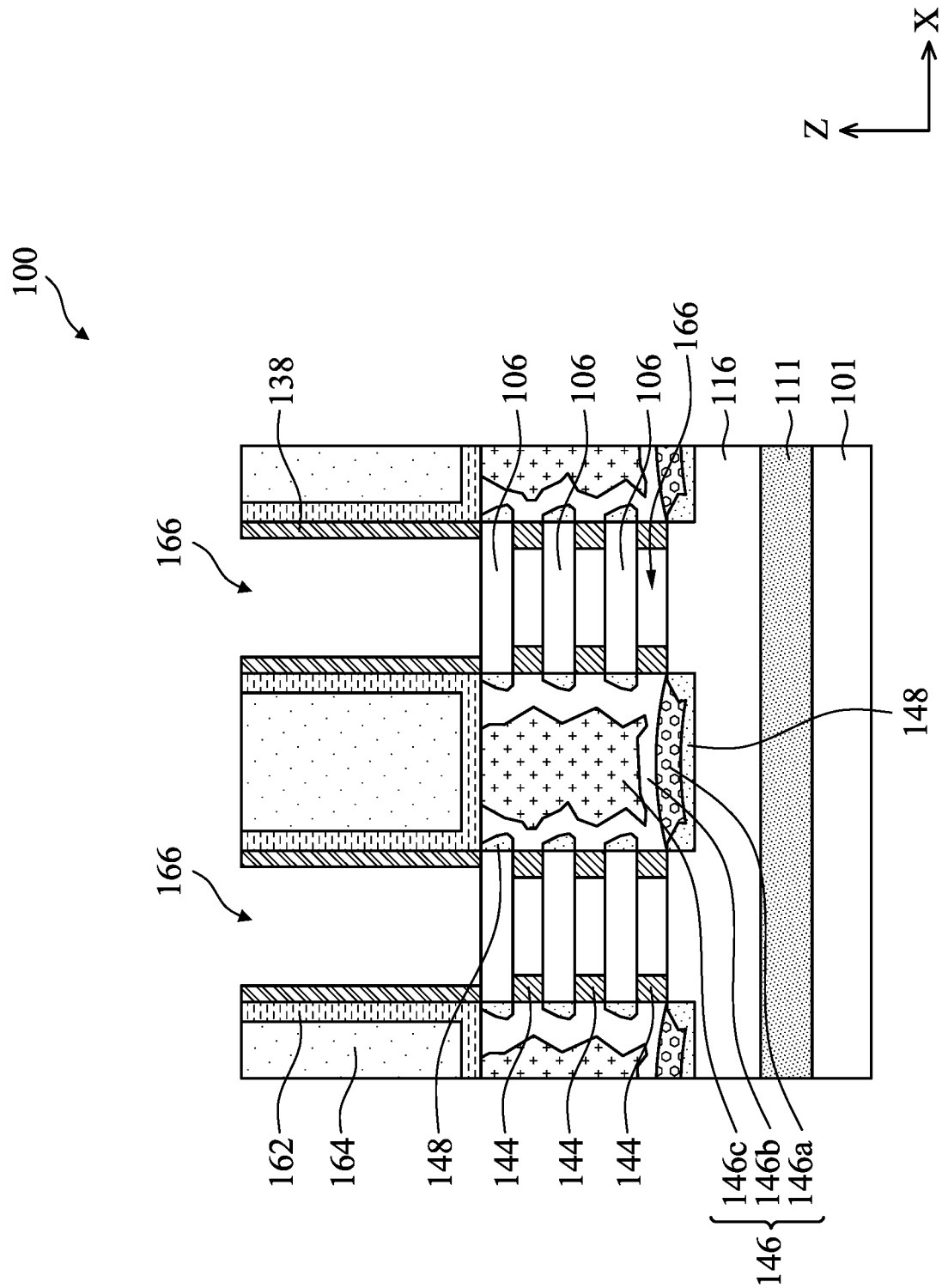

In FIG. 15, the sacrificial gate structure 130, the cladding layer 117, and the second semiconductor layers 108 are removed. The removal of the sacrificial gate structure 130 and the semiconductor layers 108 forms an opening 166 between gate spacers 138 and between first semiconductor layers 106. The first ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the first ILD layer 164, and the CESL 162.

After the removal of the sacrificial gate structure 130, the cladding layers 117 are exposed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 and the second semiconductor layers 108 but not the gate spacers 138, the first ILD layer 164, the CESL 162, the dielectric spacers 144, and the first semiconductor layers 106. As a result, a portion of the first semiconductor layers 106 not covered by the dielectric spacers 144 is exposed in the opening 166.

Figure 16:
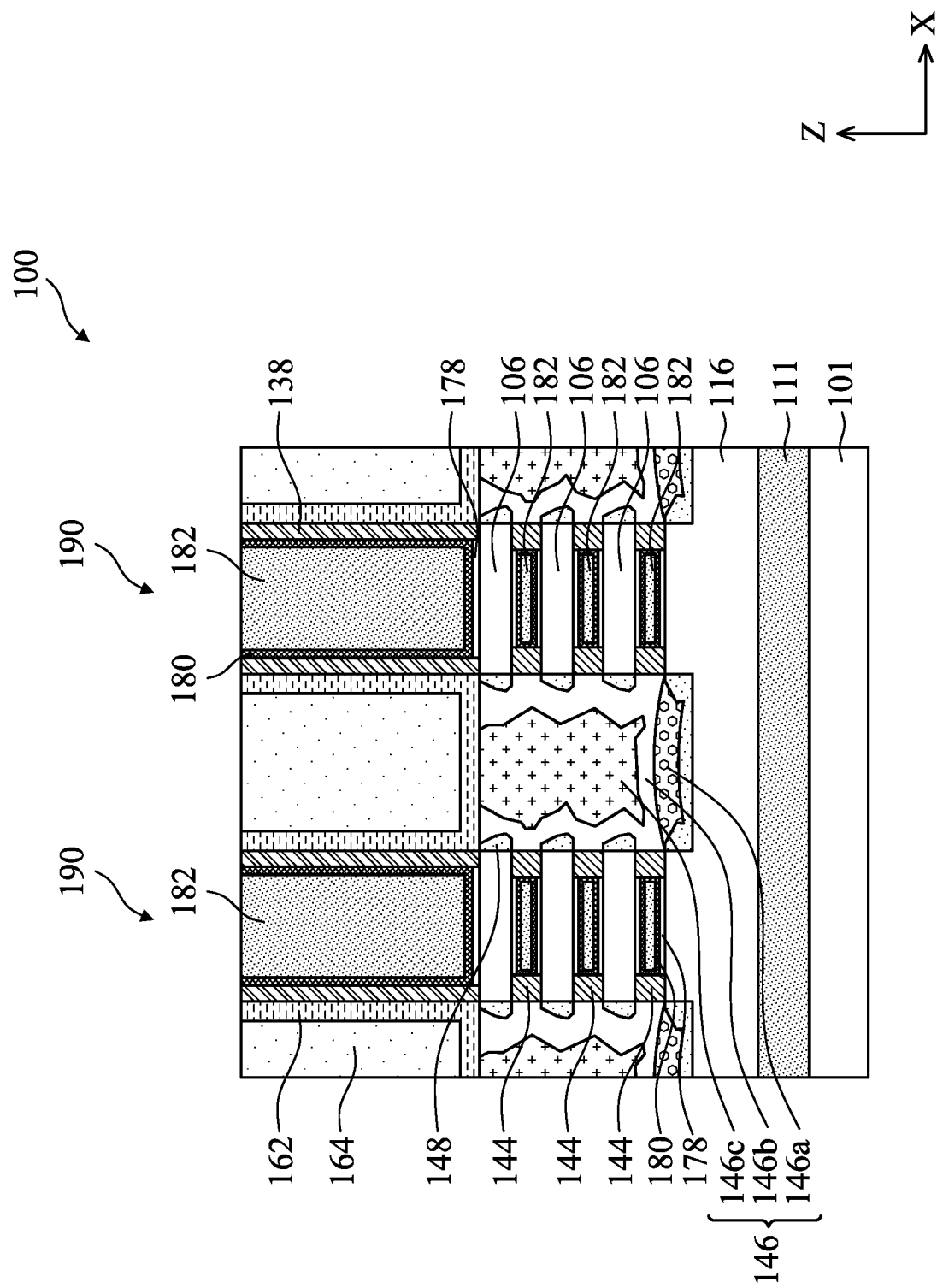

In FIG. 16, replacement gate structures 190 are formed. The replacement gate structures 190 each includes an interfacial layer (IL) 178, a gate dielectric layer 180, and a gate electrode layer 182. The interfacial layer (IL) 178 is formed to surround exposed surfaces of the first semiconductor layers 106 along the channel regions.

The IL 178 may include or be made of an oxide (e.g., silicon oxide) formed by thermal or chemical oxidation of the first semiconductor layers 106, a nitride (e.g., silicon nitride, silicon oxynitride, oxynitride, etc.), and/or a dielectric layer (e.g., hafnium silicate). In one embodiment, the IL 178 is silicon oxide. The IL 178 may be formed by CVD, ALD, a clean process, or any suitable process. Next, the gate dielectric layer 180 is formed on the exposed surfaces of the semiconductor device structure 100 (e.g., on the IL 178, sidewalls of the gate spacers 138, the top surfaces of the first ILD layer 164, the CESL 162, and the dielectric spacers 144). The gate dielectric layer 180 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 180 may be a conformal layer formed by a conformal process, such as an ALD process, a PECVD process, a molecular-beam deposition (MBD) process, or the like, or a combination thereof. The gate dielectric layer 180 may have a thickness in a range of about 0.3 nm to about 5 nm.

After formation of the IL 178 and the gate dielectric layer 180, the gate electrode layer 182 is formed on the gate dielectric layer 180. The gate electrode layer 182 fills the openings 166 (FIG. 15) and surrounds a portion of each of the first semiconductor layers 106. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 182 may be formed by PVD, CVD, ALD, electro-plating, or other suitable method. In some embodiments, one or more optional conformal layers (not shown) can be conformally (and sequentially, if more than one) deposited between the gate dielectric layer 180 and the gate electrode layer 182.

The one or more optional conformal layers can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

Portions of the gate electrode layer 182, the one or more optional conformal layers (if any), and the gate dielectric layer 180 above the top surfaces of the first ILD layer 164, the CESL 162, and the gate spacers 138 may be removed by a planarization process, such as by a CMP process.

Figure 17:
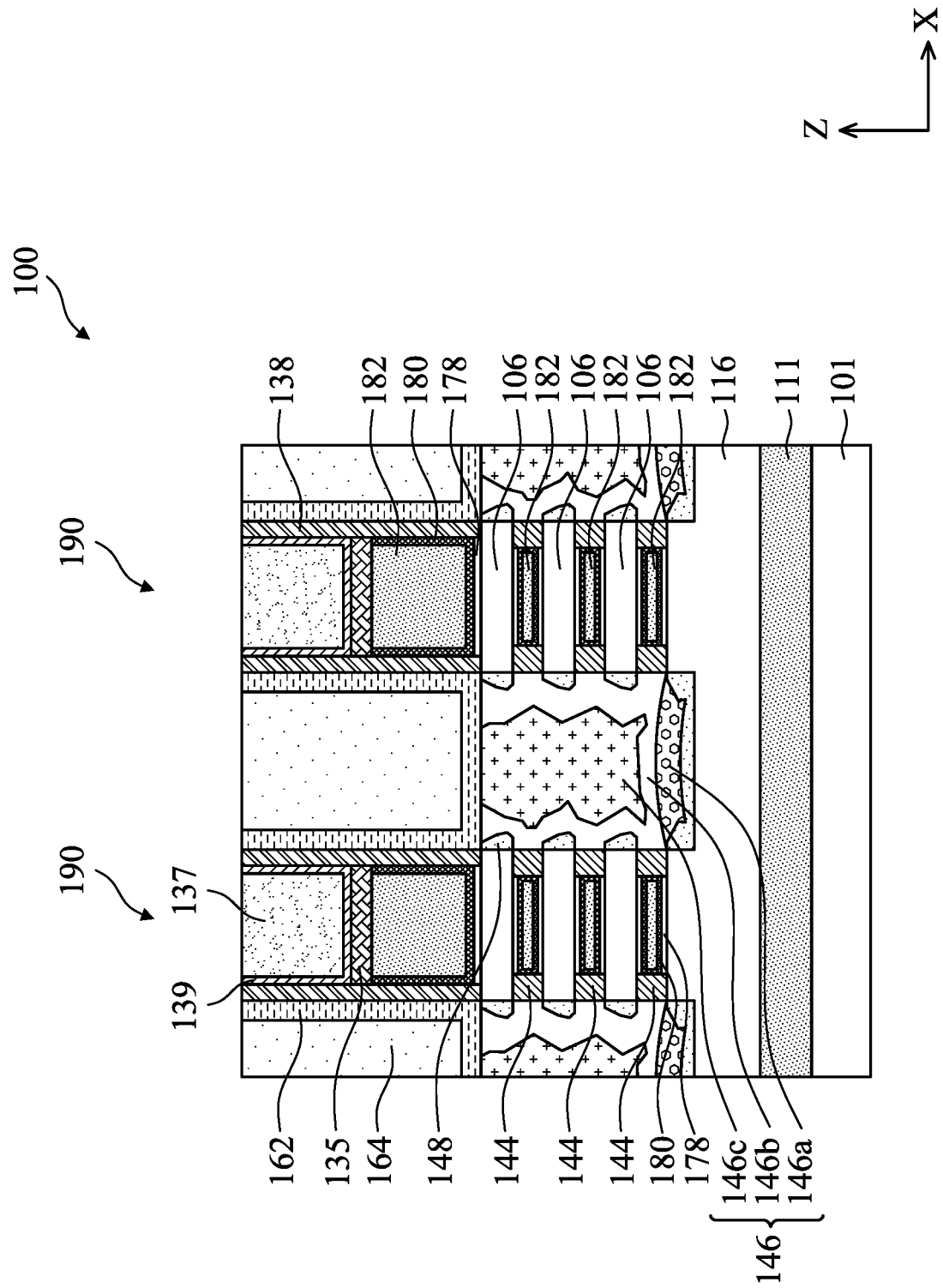

In FIG. 17, in some embodiments the replacement gate structures 190 may further include a metal gate capping layer 135 and a self-aligned contact (SAC) layer 137. In such cases, one or more metal gate etching back (MGEB) processes (e.g., a dry etching process, a wet etching process, or a combination thereof) may be performed so that the top surfaces of the gate electrode layer 182, the gate dielectric layer 180, and one or more conformal layers (if present) are recessed to a level below the top surface of the gate spacers 138. In some embodiments, the gate spacers 138 are also recessed to a level below the top surface of the first ILD layer 164. A deposition process is then performed to form the metal gate capping layer 135 on at least the top surfaces of the gate electrode layer 182 and the gate dielectric layer 180. The metal gate capping layer 135 and the underlying gate electrode layer 182 and the gate dielectric layer 180 include different materials so that the metal gate capping layer 135 can protect the underlying gate electrode layer 182 and the gate dielectric layer 180 from damage during subsequent processing. In some embodiments, the metal gate capping layer 135 may be or include a metal-containing material such as tungsten (e.g., fluorine free tungsten), cobalt, aluminum, ruthenium, titanium, copper, molybdenum, multi-layers thereof, a combination thereof, or the like. The metal gate capping layer 135 may be formed using any suitable deposition process such as ALD, a cyclic chemical vapor deposition (CCVD), CVD, PVD, plating, a combination thereof, or the like. The metallic surfaces of the multiple layers of work function of metal of the gate electrode layer 182 promote selective growth of the metal gate capping layer 135 on the gate electrode layer 182, but not on the dielectric material of the gate spacers 138. Thus, the metal gate capping layer 135 may be formed in a bottom-up fashion. The metal gate capping layer 135 formed by bottom-up growth may have fewer defects (e.g., seams), which may improve the performance of the semiconductor device structure 100.

In cases where the metal gate capping layer 135 includes tungsten or molybdenum, precursors used during the deposition process may include tungsten chloride (WClx, where x=2-6) precursors, tungsten halide precursors, molybdenum chloride (MoClx, where x=2-6) precursors, molybdenum chloride precursors, or the like. In some cases, the deposition process may use non-fluoride precursors, meaning that the precursors do not contain fluoride (e.g., tungsten fluorides, molybdenum fluorides) since fluoride can damage the deposited gate electrode layer 182 by etching. In some embodiments, the metal gate capping layer 135 may have a thickness in a range from about 1 nm to about 10 nm.

Next, the SAC layer 137 is formed over the metal gate capping layer 135. The SAC layer 137 may be a dielectric material having an etch selectivity relative to the first ILD layer 164. Suitable materials for the SAC layer 137 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, SiOCN, ZrN, SiCN, or any combinations thereof. The SAC layer 137 may be formed by a suitable deposition process, such as CVD, FCVD, PVD, or ALD. The SAC layer 137 is to be removed in subsequent process and serve as self-alignment feature for contact via openings to connect with the source/drain metal contacts (e.g., conductive features 189, FIG. 21). In some embodiments, prior to forming the SAC layer 137, an optional liner 139 may be conformally formed on the metal gate capping layer 135 and on sidewalls of the gate spacers 138. The liner 139 may function as a diffusion barrier for the gate electrode layer 182 and work with the metal gate capping layer 135 to prevent oxidation of the gate electrode layer 182 during subsequent processes. The liner 139 may be formed of a dielectric layer such as SiON. Alternatively, the liner 139 may be formed of a dielectric layer that is free of oxygen atoms so that it does not oxidize the metal gate capping layer 135 and the gate electrode layer 182. In such cases, the liner 139 may include SiN, SiC, SiCN, ZrN, or the like, or any combination thereof. The liner 139 may be formed by a suitable deposition process, such as ALD, CVD, or PVD.

Figure 18:
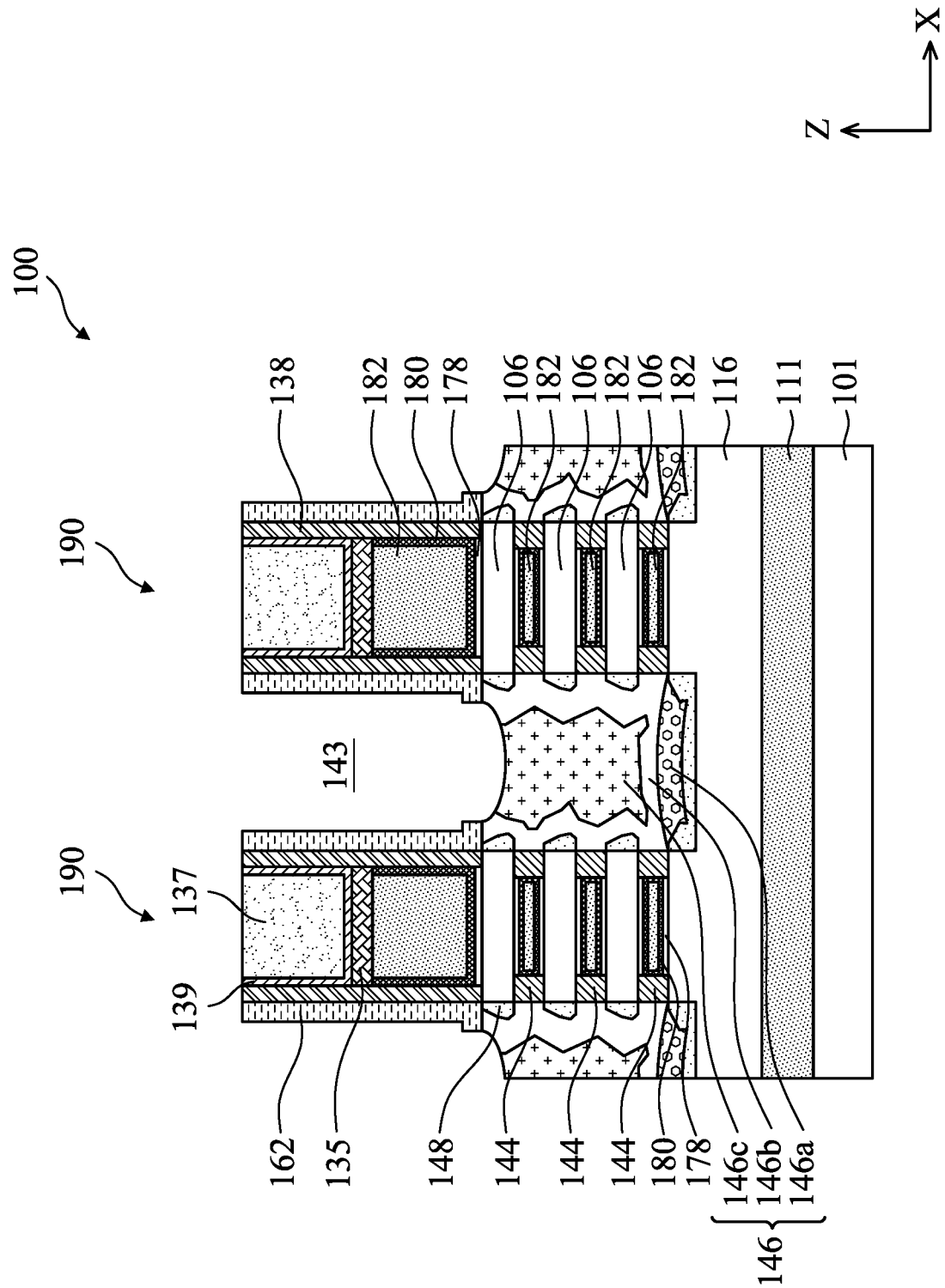

In FIG. 18, after formation of the metal gate capping layer 135 and the SAC layer 137, contact openings 143 are formed through the first ILD layer 164 and the CESL 162 to expose the epitaxial S/D feature 146. In some embodiments, the contact openings 143 extends partially into the epitaxial S/D feature 146 to expose portions of the second epitaxial layer 146b and the third epitaxial layer 146c. The contact openings 143 may be formed by a patterning process, which includes lithography processes and/or one or more etching processes, such as an anisotropic etching process. The one or more etching processes may be a plasma etching process employing etchants such as chlorine-containing gas, a bromine-containing gas, and/or a fluorine-containing gas. The patterning process may be performed such that the top surfaces of the second epitaxial layer 146b and the third epitaxial layer 146c have a curved (e.g., concave) profile.

Figure 19:
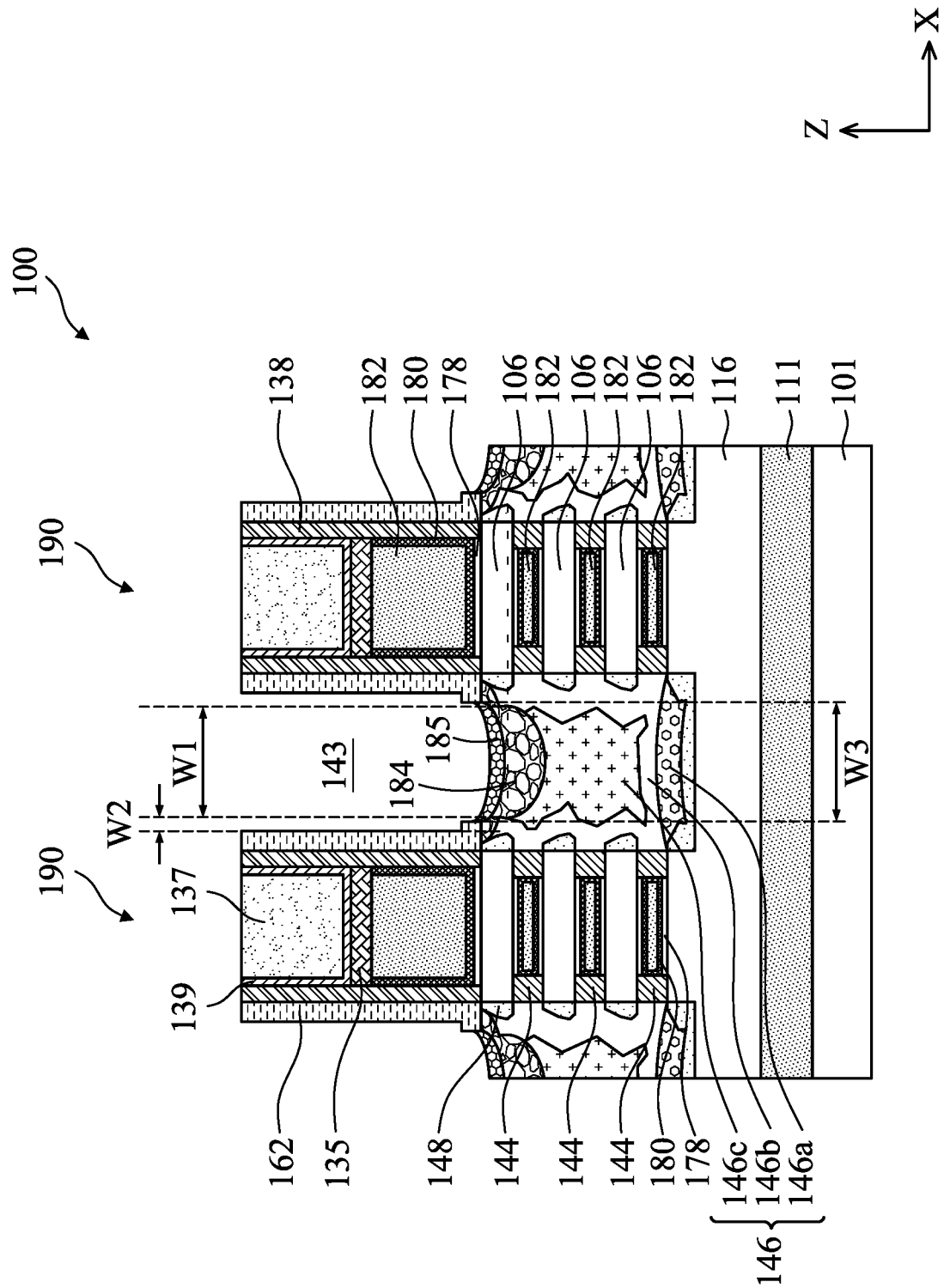
Figure 20:
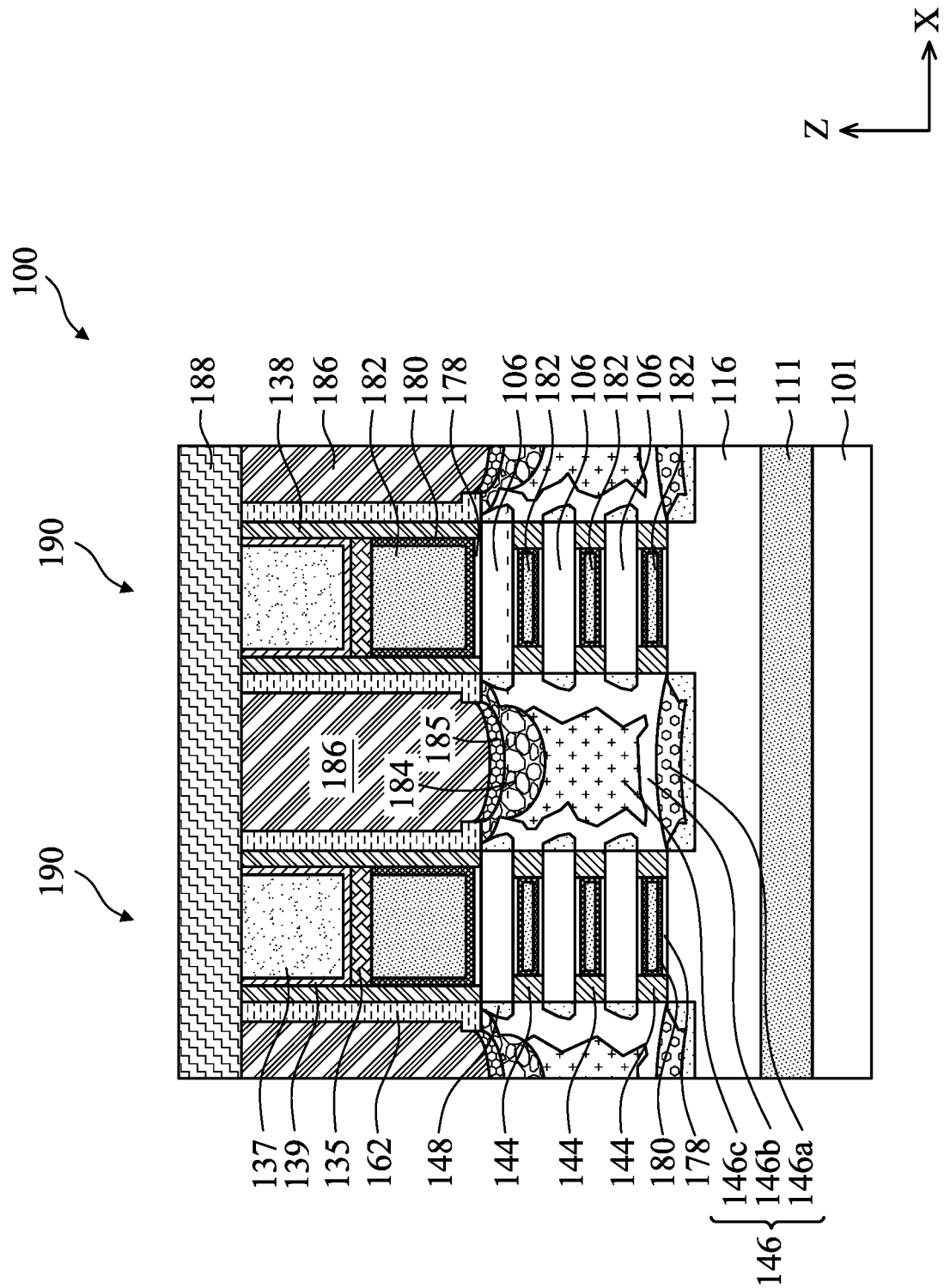

In FIG. 19, a front side silicide layer 184 is selectively formed over a top surface of the epitaxial S/D features 146 exposed by the contact openings 143. In some embodiments, the front side silicide layer 184 is in contact with the second epitaxial layer 146b and the third epitaxial layer 146c. In some embodiments, the front side silicide layer 184 is further in contact with the facetted structure 148. In some embodiments, the front side silicide layer 184 is further in contact with the facetted structure 148 and the CESL 162. In any case, the front side silicide layer 184 conductively couples the epitaxial S/D features 146 to the subsequently formed front side source/drain contacts 186 (FIG. 20). The front side silicide layer 184 may be formed by selective growth of a metal source layer to cover exposed surfaces of the second epitaxial layer 146b and the third epitaxial layer 146c and performing a rapid thermal annealing process. In some embodiments, the metal source layer includes a metal layer selected from but not limited Ti, TiSi, TiSiN, TiN, Co, CoSi, Ni, NiSi, NiCo, Pt, Ni(Pt), Jr, Pt(Ir), Er, Yb, Pd, Rh, Nb, WSi, RuSi, MoSi. The metal source layer may be deposited using CVD, LPCVD, PVD, sputtering, or the like.

An exemplary selective growth process for forming a TiSiN metal source layer may include: (1) a pre-heat stage in which the semiconductor device structure 100 is heated to a substrate temperature of about 450° C. or less, for example about 200° C. to about 350° C., and disposed within a process chamber operating at a chamber pressure of about 1 Torr to about 10 Torr for about 10 seconds to about 20 seconds; (2) a first deposition stage in which the semiconductor device structure 100 is exposed to a gas mixture comprising titanium-containing precursor (e.g., $TiCl_4$), a carrier gas (e.g., $H_2$), a nitrogen-containing precursor (e.g., $NH_3$), and an inert gas (e.g., Ar) at a chamber pressure of about 1 Torr to about 10 Torr for about 100 seconds to about 150 seconds, with an RF power in a range of about 80 W to about 250 W using a tunable frequency ranging from about 2 MHz to about 13.56 MHz; (3) a second deposition stage in which the substrate 101 is continuously exposed to the gas mixture used in the first deposition stage at a chamber pressure of about 0.1 Torr to about 1.5 Torr for about 1 second to about 10 seconds, with an RF power in a range of about 800 W to about 1500 W using a tunable frequency ranging from about 2 MHz to about 13.56 MHz; and (4) a plasma treatment process in which the semiconductor device structure 100 is exposed to a hydrogen/argon-based plasma at a chamber pressure of about 0.1 Torr to about 1.5 Torr for about 1 second to about 5 seconds, with an RF power in a range of about 200 W to about 500 W using a tunable frequency ranging from about 2 MHz to about 13.56 MHz. In some embodiments, the pre-heat stage may be performed for 0 to 2 cycles, the first deposition stage may be performed for 0 to 2 cycles, the second deposition stage may be performed for 1 to 10 cycles, and the plasma treatment process may be performed for 1 to 10 cycles.

After the formation of the metal source layer, a rapid thermal anneal process, for example, a rapid anneal at a temperature between about 700° C. and about 900° C., may be performed. During the rapid anneal process, the portion of the metal source layer over the epitaxial S/D features 146 reacts with silicon in the epitaxial S/D features 146 to form the front side silicide layer 184. In certain embodiments, the front side silicide layer 184 comprises $TiSi_xN$. Unreacted portion of the metal source layer is then removed. The resulting front side silicide layer 184 is in contact with the second epitaxial layer 146b and the third epitaxial layer 146c. In some embodiments, the portion of the metal source layer is also reacted with silicon in the facetted structures 148 so that the front side silicide layer 184 as formed is further in contact with the facetted structures 148, as shown in FIG. 19.

In some embodiments, the front side silicide layer 184 may have a thickness in a range between about 5 nm and 50 nm. The front side silicide layer 184 contacting the third epitaxial layer 146c may have a width W1 in a range of about 5 nm to about 60 nm. The front side silicide layer 184 contacting the second epitaxial layer 146b may have a width W2 in a range of about 5 nm to about 20 nm. In some embodiments, the bottom of the front side silicide layer 184 is at or slightly above an interface defined by the IL 178 and a top surface of the second first semiconductor layer 106 from the top of the stack of the semiconductor layers 104 (FIG. 14).

After the front side silicide layer 184 is formed, a front side metal capping layer 185 is selectively formed on the front side silicide layer 184. The front side metal capping layer 185 is deposited to cover the exposed surfaces of the front side silicide layer 184. The front side metal capping layer 185 may be formed from Ti, Ta, TiN, TaN, W, Co, Ru, or the like. In one embodiment, the front side metal capping layer 185 is a metal nitride, such as TiN. The front side metal capping layer 185 serves as a protection layer while facilitating subsequent bottom-up metal fill. In either case, the front side metal capping layer 185 selectively forms on the front side silicide layer 184 which includes metallic material, and does not form or does not substantially form on the sidewalls of the CESL 162, which includes dielectric material. The front side metal capping layer 185 may be deposited using any suitable deposition process such as ALD, CCVD, CVD, LPCVD, PVD, plating, a combination thereof, or the like. An exemplary deposition process for forming the front side metal capping layer 185 may include exposing the semiconductor device structure 100 to a gas mixture comprising a nitrogen-containing precursor (e.g., $NH_3$), a carrier gas (e.g., $H_2$), and an inert gas (e.g., Ar) at a chamber pressure of about 5 Torr to about 15 Torr for about 1 second to about 15 seconds, with an RF power in a range of about 450 W to about 1000 W using a tunable frequency ranging from about 2 MHz to about 13.56 MHz. In some embodiments, the deposition process may be performed for 0 to 2 cycles. The front side metal capping layer 185 may have a thickness that is less than the thickness of the front side silicide layer 184. In one embodiment, the front side metal capping layer 185 has a thickness in a range from about 3 nm to about 40 nm. The front side metal capping layer 185 contacting the front side silicide layer 184 may have a width W3 in a range of about 3 nm to about 10 nm. The front side silicide layer 184 and the front side metal capping layer 185 may be deposited in the same chamber, or on the same platform, without exposing the front side silicide layer 184 to atmosphere.

In FIG. 20, a conductive material is deposited to fill contact openings 143 (FIG. 19) and over a top surface of the SAC layer 137 to form the front side source/drain contacts 186. The front side source/drain contacts 186 may be formed from a conductive material, which may include but is not limited to, W, Co, Ru, Ti, Ni, Cu, Au, Ag, Pt, Pd, Jr, Os, Rh, Al, Mo, TaN, or the like. The front side source/drain contacts 186 may be formed by a suitable deposition process, such as CVD, PVD, plating, ALD, or other suitable technique. Subsequently, a CMP process is performed to remove a portion of the conductive material layer until the top surface of the SAC layer 137 is exposed. Next, a second ILD layer 188 is formed on the front side source/drain contacts 186, the CESL 162, the gate spacers 138, the SAC layer 137, and the optional liner 139. The second ILD layer 188 may include the same material as the first ILD layer 164.

Figure 21:
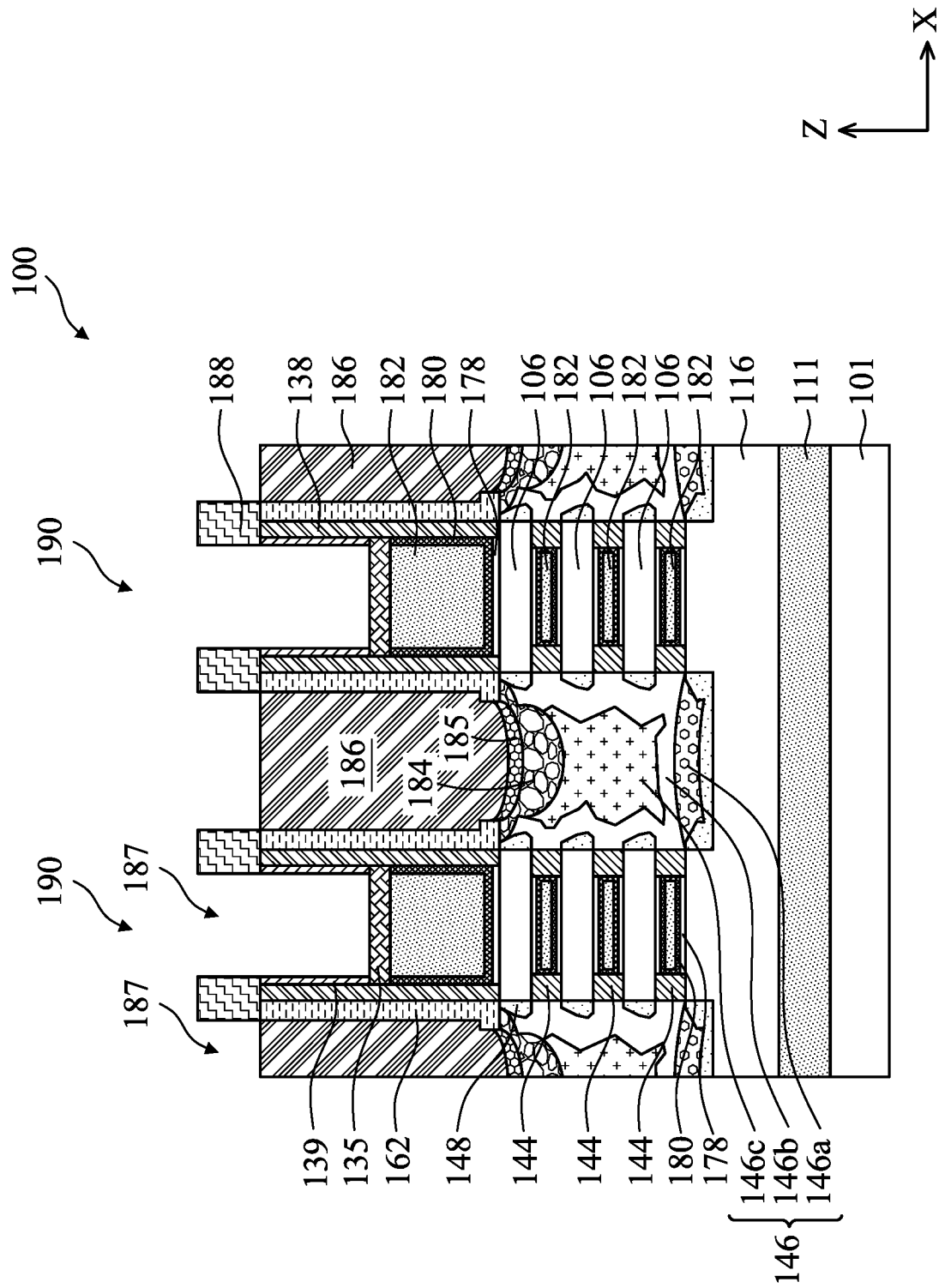

In FIG. 21, portions of the second ILD layer 188 and SAC layer 137 are removed to form contact via openings 187. The contact via openings 187 are aligned so that some contact via openings 187 extend through the second ILD layer 188 to expose a top surface of the front side source/drain contacts 186, while other contact via openings 187 extend through the second ILD layer 188 and the SAC layer 137 to expose the metal gate capping layer 135. The contact via openings 187 may be formed using one or more etching processes, such as anisotropic etch processes. The etchants used during the one or more etching processes are chosen to selectively remove the dielectric materials (e.g., second ILD layer 188, the SAC layer 137, and the liner 139) without significantly affecting the metallic material (e.g., metal gate capping layer 135). In some embodiments, the liner 139 may also be removed during the one or more etching processes.

Figure 22:
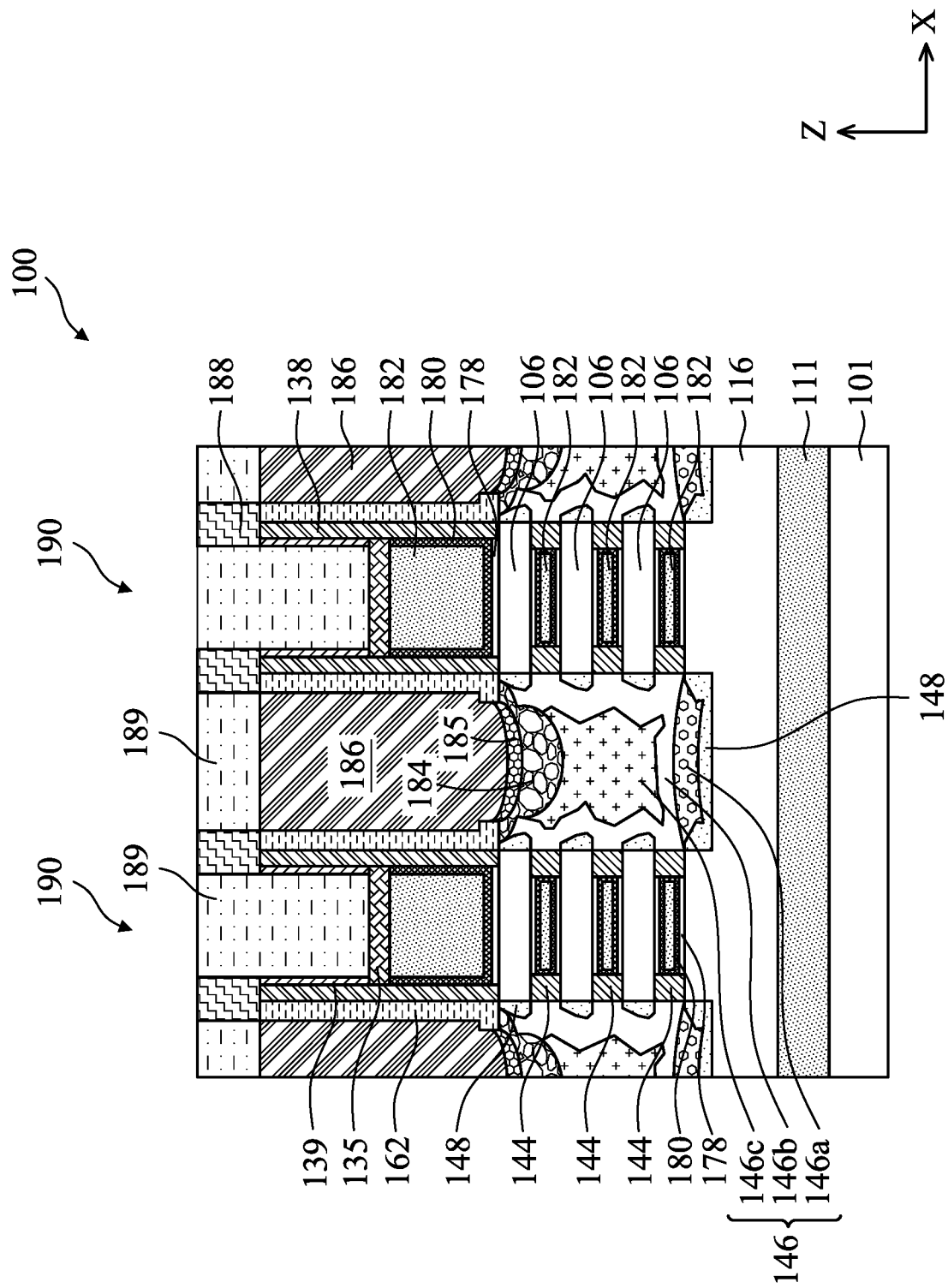

In FIG. 22, the contact via openings 187 are filled with a conductive material to form conductive features 189. The conductive features 189 in contact with the front side source/drain contacts 186 may be referred to as source/drain contact vias, and the conductive features 189 in contact with the metal gate capping layer 135 (if present) or the gate electrode layer 182 may be referred to as metal gate contact via, respectively. The conductive material may be or include tungsten, cobalt, copper, ruthenium, aluminum, gold, silver, alloys thereof, or a combination thereof, and may be deposited by CVD, ALD, PVD, or any suitable deposition technique. While not shown, each conductive feature 189 may further include an adhesion layer (e.g., Ti, Ta, or the like) conformally deposited in the contact via openings 187 (FIG. 21) on exposed surfaces of the second ILD 142, the front side source/drain contacts 186, the liner 139 (if present), and the metal gate capping layer 135 (if present), and a barrier layer (e.g., TiN, TaN, or the like) conformally deposited on the adhesion layer, and both can be deposited by ALD, CVD, or any suitable deposition technique. Portions of the conductive features 189 above the top surfaces of the second ILD layer 188 may be removed by a planarization process, such as by a CMP process. As a result of the planarization process, the top surfaces of the second ILD layer 188 and the conductive features 189 are substantially co-planar.

Figure 23:
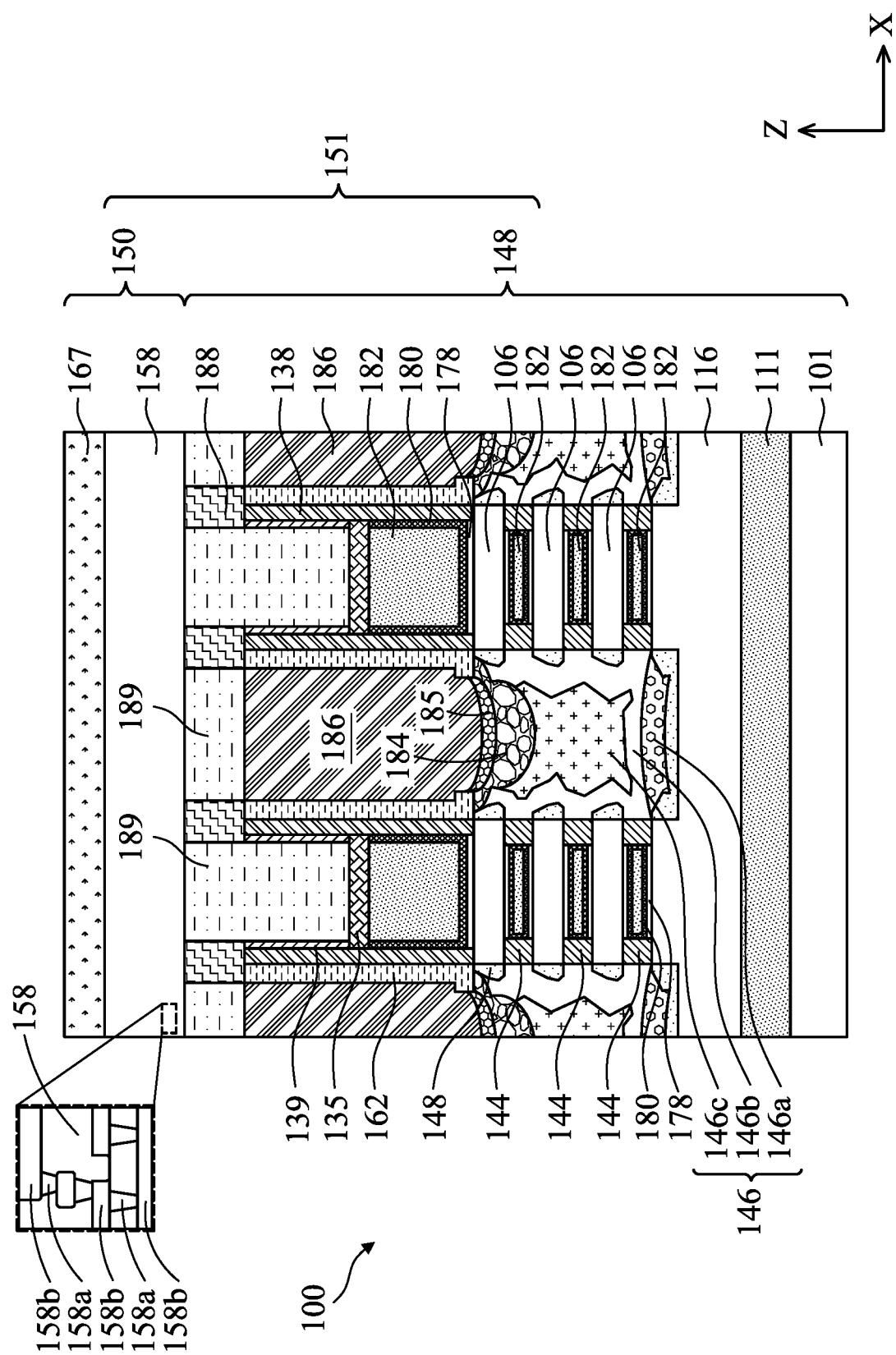

In FIG. 23, an interconnect structure layer 150 is formed over the semiconductor device structure 100. For ease of illustration purpose, the layer structure of the semiconductor device structure 100 is referred to herein as a transistor structure layer 148. The transistor structure layer 148 and the interconnect structure layer 150 can be referred to as a device wafer 151. The interconnect structure layer 150 can include a back-end-of-line (BEOL) interconnect structure formed on the front side of the semiconductor device structure 100. The interconnect structure layer 150 may include a plurality of dielectric layers 158 and a plurality of vertical interconnect features, such as vias 158a, and horizontal interconnect features, such as metal lines 158b, embedded in dielectric layers 158. A dielectric layer (e.g., dielectric layer 158) having metal lines or vias can be referred to as a metal layer. In some cases, the interconnect structure layer 150 may include 8 metal layers or more, such as 10 metal layers or more, depending on the application.

One or more metal lines 158b in the dielectric layer 158 may be aligned and in contact with the conductive features 189 (e.g., source/drain contact vias) contacting the front side source/drain contacts 186, and one or more metal lines 158b in the dielectric layer 158 may be aligned and in contact with the conductive features 189 (e.g., metal gate contact via) contacting the gate electrode layer 182, thereby providing electrical connection between the metal line 154 and the replacement gate stack 190. In some embodiments, the metal lines 158b and vias 158a are configured such that elements of the transistors (e.g., epitaxy S/D features 146 at the drain region and the gate electrode layer 182 of the replacement gate stack 190) are electrically connected with solder balls or bonding pads that may be found in a back-end packaging structure (not shown) through various metal lines 158b and vias 158a in the dielectric layer 158.

Once the interconnect structure layer 150 is formed, a carrier wafer 167 is temporarily bonded to a top side of the interconnect structure layer 150, as shown in FIG. 23. The carrier wafer 167 serves to provide mechanical support for the interconnect structure layer 150 and the transistor structure layer 148 so as to facilitate backside processing of the transistor structure layer 148.

Figure 24:
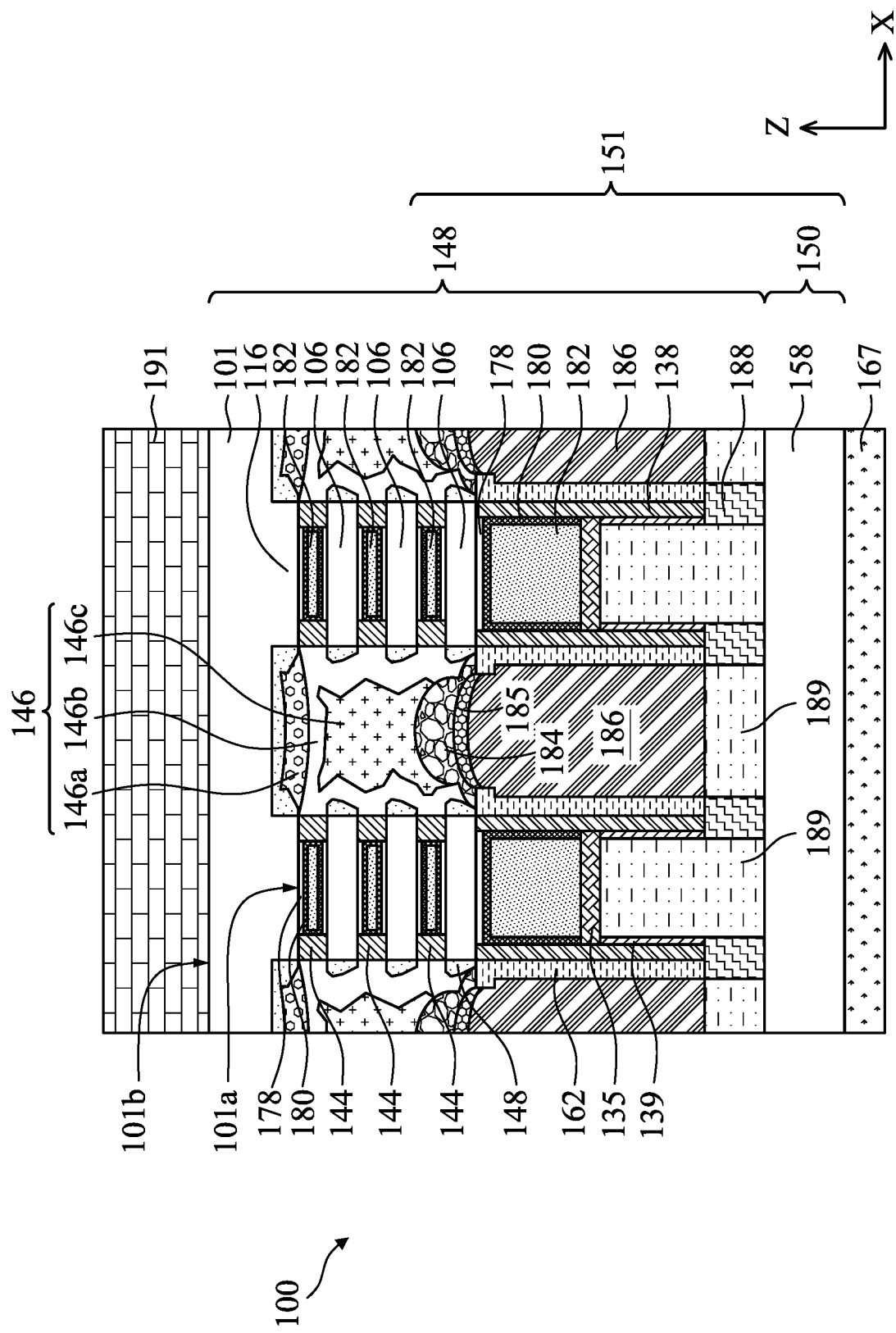

In FIG. 24, the carrier wafer 167 is flipped over so that the backside 101b of the substrate 101 is facing up. The backside 101b is opposed to the front side 101f of the substrate 101. After the carrier wafer 167 is flipped, a planarization process, such as a CMP, is performed to remove portions of the substrate 101 on the backside. The planarization process may be a two-stage process in which a portion of the substrate 101 is first removed to expose the sacrificial layer 111 during a first stage of the planarization process, and then the sacrificial layer 111 is removed during a second stage of the planarization process to expose a portion of the substrate 101. The planarization process stops as soon as the sacrificial layer 111 is fully removed and the portion of the substrate 101 is revealed. Next, a hard mask layer 191 is formed on the backside of the substrate 101. The hard mask layer 191 is deposited to help selective growth of subsequent backside silicide layers on the sidewalls of the silicon substrate 101 and not on the sidewalls of the hard mask layer 191, thereby facilitating filling of the subsequent metal contacts during the deposition process. The hard mask 191 may include or be made of any suitable dielectric material, such as SiOCN, SiON, SiO, SiN, or the like, and may be formed by any suitable deposition process, such as CVD or PVD.

Figure 25:
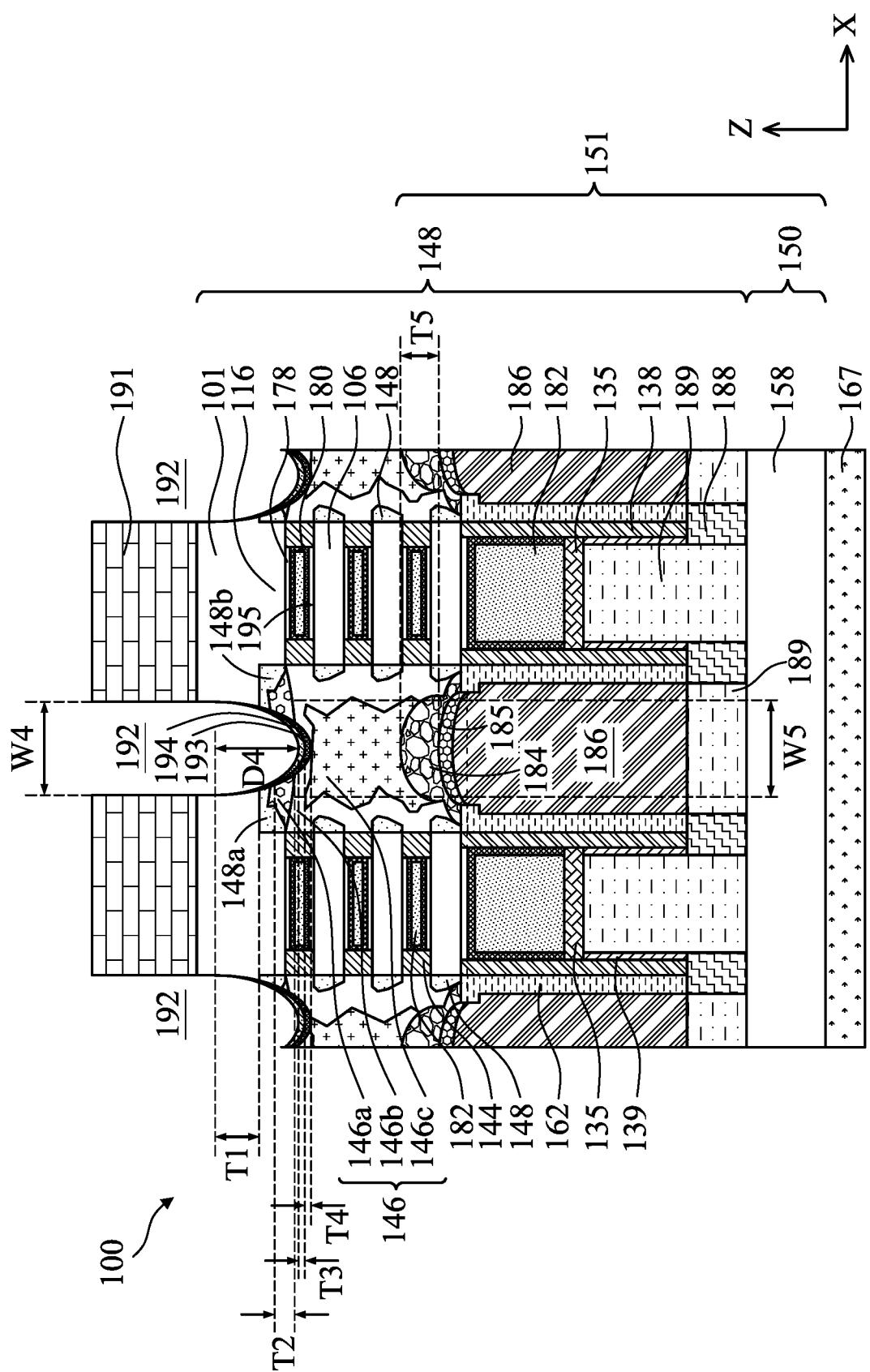

In FIG. 25, contact openings 192 are formed through the hard mask layer 191 and the substrate 101 to expose the epitaxial S/D feature 146. The contact openings 192 expose the sidewalls of the hard mask layer 191 and the substrate 101. In some embodiments, the contact openings 192 further extends through the facetted structure 148, the first epitaxial layer 146a, the second epitaxial layer 146b, and slightly into the third epitaxial layer 146c. The contact openings 192 may be formed by a patterning process, which includes lithography processes and/or one or more etching processes. Likewise, the patterning process may be performed such that the exposed backside surfaces of the facetted structure 148, the first epitaxial layer 146a, the second epitaxial layer 146b, and the third epitaxial layer 146c have a curved (e.g., concave) profile. An exemplary etching process may be a plasma-based etching process including exposing the semiconductor device structure 100 to one or more etchants containing carbon-fluorine bonds (e.g., $C_4F_6$ and/or $C_4F_8$), one or more oxygen-containing precursors (e.g., $O_2$ and/or CO), an inert gas (e.g., Ar) at a chamber pressure of about 1 mTorr to about 60 mTorr for about 1 second to about 60 seconds, with an RF power in a range of 0 W to about 350 W using a tunable frequency ranging from about 2 MHz to about 13.56 MHz, and the output of the RF power is controlled by a pulse signal having a duty cycle in a range of about 20% to about 55%. In some embodiments, the etching process may be performed for about 1 to 20 cycles.

After the contact openings 192 are formed, a backside silicide layer 193 and a backside metal capping layer 194 are formed through the contact openings 192. The backside silicide layer 193 is selectively formed on the exposed surfaces of the facetted structure 148, the first epitaxial layer 146a, the second epitaxial layer 146b, and the third epitaxial layer 146c. In some embodiments, the backside silicide layer 193 is further in contact with the sidewalls of the substrate 101. In some embodiments, the third epitaxial layer 146c is enclosed within and in contact with the backside silicide layer 193, the second epitaxial layer 146b, and the front side silicide layer 184. In most cases, the backside silicide layer 193 does not contact the sidewalls of the hard mask layer 191. The backside silicide layer 193 and the backside metal capping layer 194 may include the same material as the front side silicide layer 184 and the front side metal capping layer 185. In one embodiment, the backside silicide layer 193 is $SiTi_xN$, and the backside metal capping layer 194 is TiN. The backside silicide layer 193 and the backside metal capping layer 194 may be formed using the same selective growth process and the deposition process as discussed above with respect to the front side silicide layer 184 and the front side metal capping layer 185.

The resulting backside silicide layer 193 may have a width W4 measuring from a first end of the backside silicide layer 193 contacting a first portion 148a of the facetted structure 148 to a second end of the backside silicide layer 193 contacting a second portion 148b of the facetted structure 148 opposing the first portion 148a. The first and second portions 148a, 148b of the facetted structure 148 are in contact with the exposed surfaces of the substrate 101 and being separated by the contact opening 192. The backside silicide layer 193 contacting the third epitaxial layer 146c may have a width W5 that is less than the width W4. In some embodiments, the width W4 is about 10 nm to about 50 nm and the width W5 is about 5 nm to about 10 nm. The backside silicide layer 193 contacting the substrate 101 may have a thickness Ti, and the backside silicide layer 193 contacting the first epitaxial layer 146a may have a thickness T2. In some embodiments, the thickness T1 is greater than the thickness T2. In some embodiments, the thickness T1 is less than the thickness T2. In either case, the thickness T1 may be about 5 Å to about 50 Å, and the thickness T2 may be about 3 nm to about 20 nm. The first epitaxial layer 146a remains in contact with the backside silicide layer 193, the substrate 101, the second epitaxial layer 146b, and the dielectric spacer 144 and serves as a barrier layer that prevents current leakage from the backside silicide layer 193 to the gate region (e.g., gate electrode layer 182). Therefore, if the thickness T2 is less than about 3 nm, the barrier layer may not prevent current leakage from the backside silicide layer 193 to the gate region. On the other hand, if the thickness T2 is greater than 20 nm, the manufacturing cost is increased without obvious additional advantages for the barrier layer.

A vertical distance D4 measuring from the edge of the backside metal capping layer 194 to the center of the backside metal capping layer 194 may be about 4 nm to about 40 nm. In some embodiments, the distance D4 is greater than the thickness Ti. The center portion of the backside metal capping layer 194 may have a thickness T3 of about 3 nm to about 50 nm. The center portion of the backside silicide layer 193 may have a thickness T4 of about 5 nm to about 50 nm. In some embodiments, the center portion of the front side silicide layer 184 may have a thickness T5 greater than the thickness T4. Having a thicker front side silicide layer 184 than the backside silicide layer 193 can help boost electrical performance with respect to the contact resistance and the channel resistance between the S/D contacts 186/196 and the S/D features 146. In addition, such a difference between the front side silicide layer 184 and the backside silicide layer 193 can compensate for the EPI texture difference (e.g., first epitaxial layer 146a and the third epitaxial layer 146c) between the front side and the backside. In some embodiments, the thickness T5 is less than the distance D4. In various embodiments, the thickness T5 is about 6 nm to about 70 nm. In some embodiments, the lowest point of the backside silicide layer 193 abutting the third epitaxial layer 146c is at an elevation higher than an interface 183 defined by the bottommost first semiconductor layer 106 and the IL 178.

Figure 26:
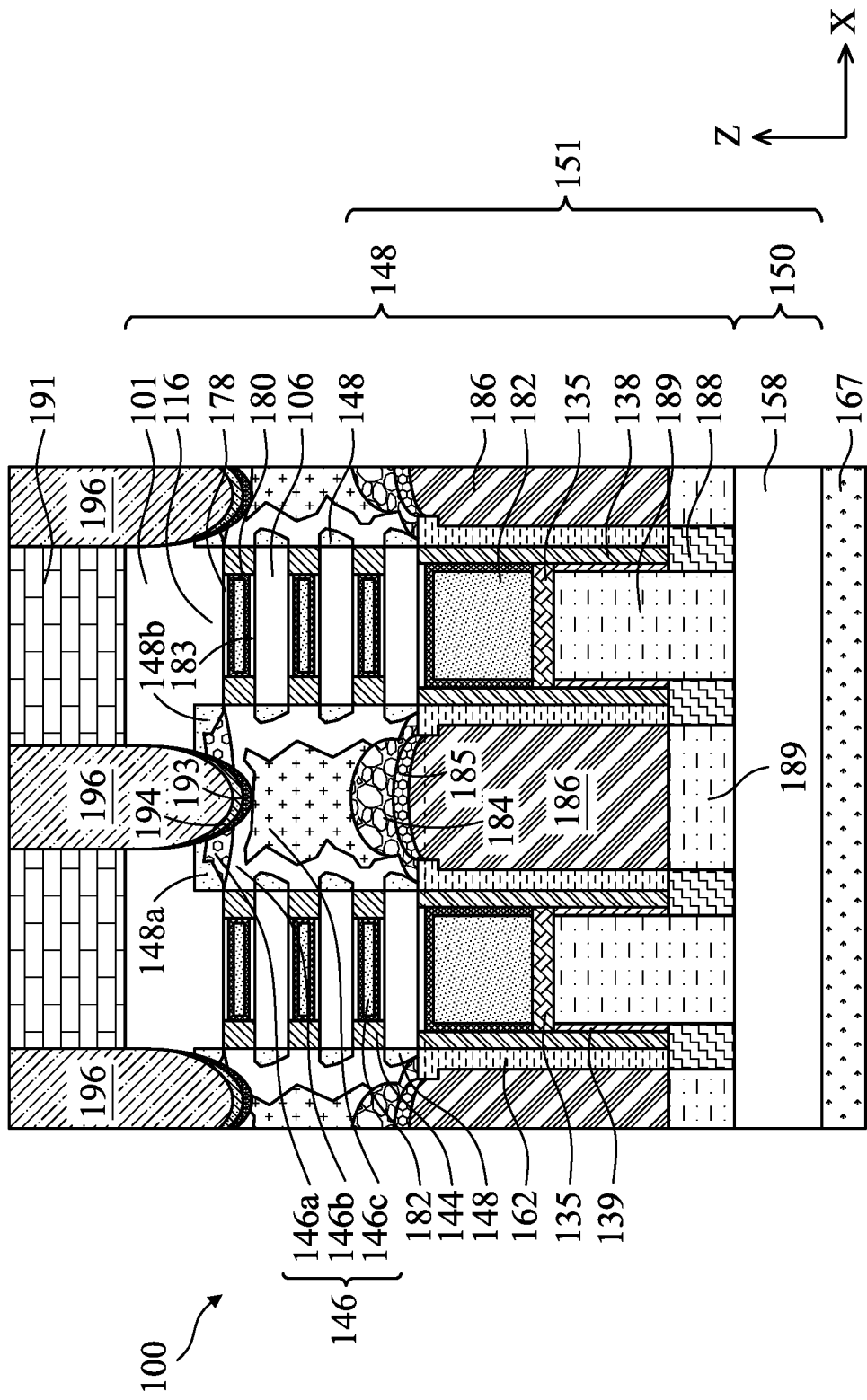

In FIG. 26, the contact openings 192 (FIG. 25) are filled with a conductive material to form backside source/drain contacts 196. In some embodiments, a cleaning process may be performed prior to filling the conductive material in the contact openings 192. The cleaning process removes unwanted impurities present in the contact openings 192 from the etching processes. In some embodiments, the cleaning process includes rinsing the semiconductor device structure 100 with 10% hydrazine ($N_2H_2$) solution. Additionally or alternatively, the cleaning process may use an SPM solution ($H_2SO_4$ and $H_2O_2$) to remove the remaining impurities from the contact openings 192.

The backside source/drain contacts 196 may include the same material as the conductive features 189 (FIG. 22). Likewise, the backside source/drain contacts 196 may further include an adhesion layer (not shown, e.g., Ti, Ta, or the like) conformally deposited in the contact openings 192 on exposed surfaces of the hard mask layer 191, the substrate 101, and the backside metal capping layer 194, and a barrier layer (not shown, e.g., TiN, TaN, or the like) conformally deposited on the adhesion layer, and both can be deposited by ALD, CVD, or any suitable deposition technique. Portions of the backside source/drain contacts 196 above the top surfaces of the hard mask layer 191 may be removed by a planarization process, such as by a CMP process. As a result of the planarization process, the top surfaces of the hard mask layer 191 and the backside source/drain contacts 196 are substantially co-planar.

Figure 27:
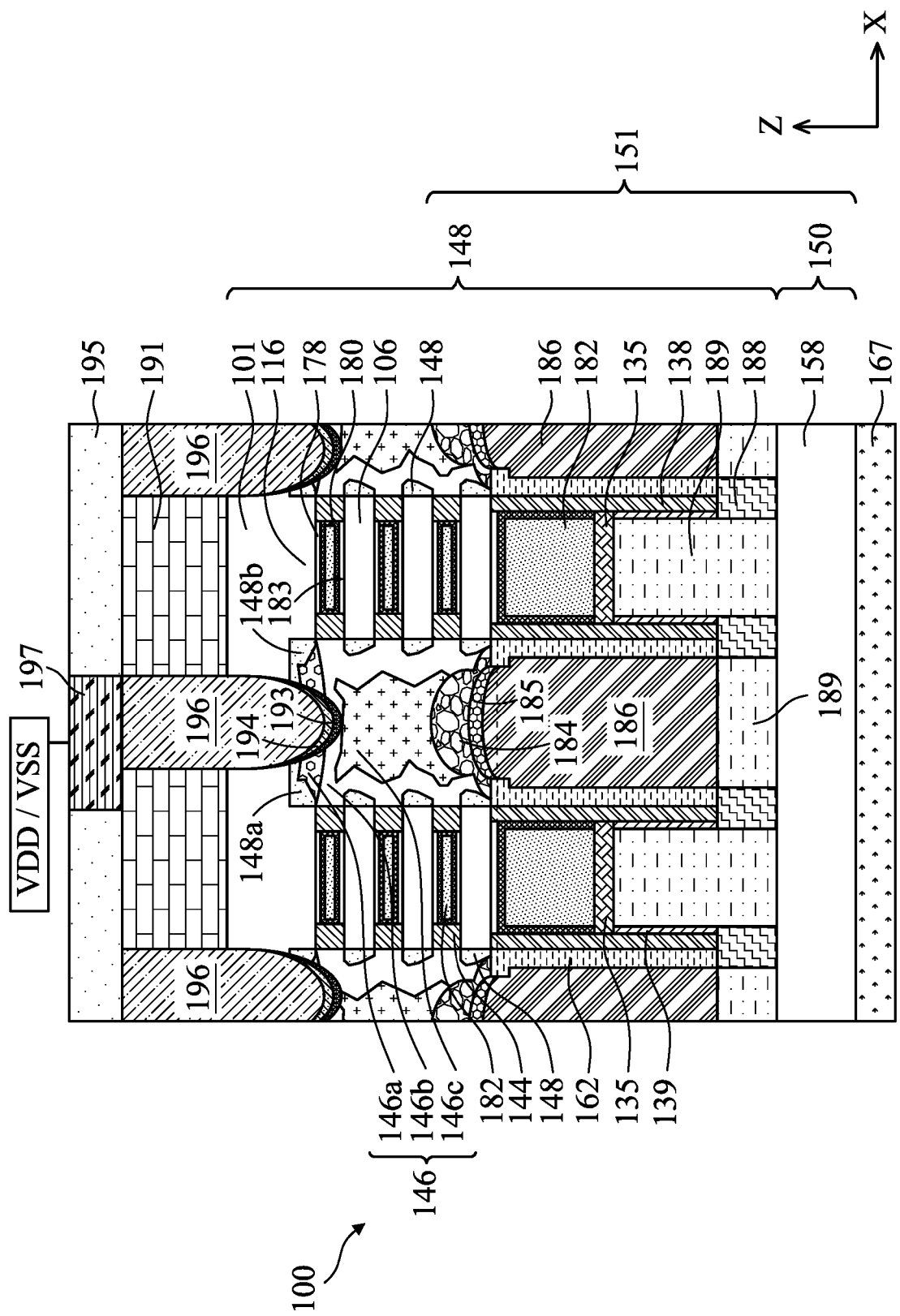

In FIG. 27, after the backside source/drain contacts 196 are formed, a third ILD layer 195 is formed over the backside of the semiconductor device structure 100. The third ILD layer 195 is disposed over the top surfaces of the backside source/drain contacts 196 and the hard mask layer 191. One or more conductive features 197 (only one is shown), which are part of power rail interconnect, are formed in the third ILD layer 195. The conductive feature 197 is in electrical communication with the epitaxial S/D features 146 (e.g., a source epitaxial feature) through the backside source/drain contacts 196, the backside metal capping layer 194, and the backside silicide layer 193. The conductive feature 197 is in electrical connection with a backside power rail 199 to be connected to a power supply. In some embodiments, the conductive feature 197 is a portion of the backside power rail 199. Depending on the conductivity type of the device, the power supply may be fed with a positive voltage (VDD) or a negative voltage (VSS) (i.e., ground or zero voltage). Having the power rail 199 relocated to connect with conductive feature 197 at the backside of the semiconductor device structure 100 allows for the device to be powered directly by a backside power, thereby enhancing the device performance, saving an amount of routing resources used on the front side of device, and reducing BEOL process complexity without abnormal electrical mis-connection issues. Particularly, since the power rail is relocated to the backside and separated from the front side source/drain contact vias (e.g., cobalt-based) and metal gate contact vias (e.g., tungsten-based), there is no growth selective loss due to material selection issues when filling metal (e.g., tungsten) in the contact openings for formation of power rail interconnect.

In some embodiments, the backside source/drain contact 196 is in electrical connection with the epitaxial S/D feature 146 through both the backside silicide layer 193 and signal/current path including the front side source/drain contact 186 and the front side silicide layer 184. In other embodiments, the conductive feature 197 may be connected to an interconnect structure other than a power rail.

Various embodiments of the present disclosure include a semiconductor device structure having epitaxial source/drain features in electrical connection with a power rail through backside source/drain contact and backside silicide layer, allowing for transistor devices to be powered directly by a backside power source while saving an amount of routing resources used on the front side of device structure. The epitaxial source/drain features are also connected to signal/current path through front side source/drain contact and front side silicide layer, thereby reducing BEOL process complexity, providing additional areas for overwriting the pitch density without abnormal electrical mis-connection issues. Particularly, the power rails are relocated to backside of the semiconductor device structure to eliminate selective loss issues that would otherwise occur if the metal filling process for power rail interconnect were to perform on the same side as the front side source/drain contact vias and metal gate contact vias.

An embodiment is a semiconductor device structure. The semiconductor device structure includes a substrate having a first side and a second side opposing the first side, a source/drain epitaxial feature disposed adjacent the first side of the substrate, wherein the source/drain epitaxial feature comprises a first epitaxial layer, a second epitaxial layer in contact with the first epitaxial layer, and a third epitaxial layer having sidewalls surrounded by and in contact with the second epitaxial layer. The device structure also includes a first silicide layer in contact with the substrate, the first, second, and third epitaxial layers, a first source/drain contact extending through the substrate from the first side to the second side, and a first metal capping layer disposed between the first silicide layer and the first source/drain contact.

Another embodiment is a semiconductor device structure. The semiconductor device structure includes a substrate having a first side and a second side opposing the first side, a source/drain epitaxial feature comprising a first silicide layer in contact with sidewalls of the substrate, a first epitaxial layer in contact with the first silicide layer, a second epitaxial layer in contact with the first epitaxial layer and the first silicide layer, a second silicide layer disposed opposing the first silicide layer and in contact with the second epitaxial layer, and a third epitaxial layer enclosed within and in contact with the first silicide layer, the second epitaxial layer, and the second silicide layer, a first source/drain contact extending through the substrate from the first side to the second side, wherein the first source/drain contact is connected to a backside power rail. The device structure also includes two or more semiconductor layers disposed adjacent the first side of the substrate, and a gate electrode layer surrounding a portion of one of the two or more semiconductor layers.

A further embodiment is a method for forming a semiconductor device structure. The method includes depositing a sacrificial gate structure over a portion of a first fin structure and a second fin structures formed from a substrate, wherein each first and second fin structure comprises a sacrificial layer and a plurality of first semiconductor layers and a plurality of second semiconductor layers alternatingly stacked, forming a source/drain feature between the first fin structure and the second fin structure, wherein the source/drain feature comprises a first epitaxial layer, a second epitaxial layer on the first epitaxial layer, and a third epitaxial layer on the second epitaxial layer. The method also includes removing the sacrificial gate structure and the plurality of second semiconductor layers to expose portions of the plurality of first semiconductor layers of the first and second fin structures, forming a gate electrode layer to surround at least the exposed portion of one of the plurality of first semiconductor layers of the first and second fin structures, depositing a first silicide layer over a front side of the substrate, wherein the first silicide layer is in contact with the second and third epitaxial layers, forming a front side source/drain contact and a front side source/drain contact via over the first silicide layer, planarizing a backside of the substrate until the sacrificial layer is removed, depositing a hard mask layer on the backside of the substrate, forming a contact opening through the hard mask layer, the substrate, the first epitaxial layer, and the second epitaxial layer to expose the third epitaxial layer, depositing a second silicide layer so that the second silicide layer is in contact with the substrate, the first epitaxial layer, the second epitaxial layer, and the third epitaxial layer, and forming a backside source/drain contact over the second silicide layer, wherein the backside source/drain contact is connected to a backside power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    depositing a sacrificial gate structure over a portion of a first fin structure and a second fin structures formed from a substrate, wherein each first and second fin structure comprises a sacrificial layer and a plurality of first semiconductor layers and a plurality of second semiconductor layers alternatingly stacked;
    forming a source/drain feature between the first fin structure and the second fin structure, wherein the source/drain feature comprises a first epitaxial layer, a second epitaxial layer on the first epitaxial layer, and a third epitaxial layer on the second epitaxial layer;
    removing the sacrificial gate structure and the plurality of second semiconductor layers to expose portions of the plurality of first semiconductor layers of the first and second fin structures;
    forming a gate electrode layer to surround at least the exposed portion of one of the plurality of first semiconductor layers of the first and second fin structures;
    depositing a first silicide layer over a front side of the substrate, wherein the first silicide layer is in contact with the second and third epitaxial layers;
    forming a front side source/drain contact and a front side source/drain contact via over the first silicide layer;
    planarizing a backside of the substrate until the sacrificial layer is removed;
    depositing a hard mask layer on the backside of the substrate;
    forming a contact opening through the hard mask layer, the substrate, the first epitaxial layer, and the second epitaxial layer to expose the third epitaxial layer;
    depositing a second silicide layer so that the second silicide layer is in contact with the substrate, the first epitaxial layer, the second epitaxial layer, and the third epitaxial layer; and
    forming a backside source/drain contact over the second silicide layer, wherein the backside source/drain contact is connected to a backside power rail.

2. The method of claim 1, further comprising:
    prior to forming the source/drain feature, forming a facetted structure on exposed surfaces of the plurality of first semiconductor layers of the first and second fin structures.

3. The method of claim 2, wherein the first silicide layer has a first thickness and the second silicide layer has a second thickness less than the first thickness.

4. The method of claim 1, further comprising:
    after forming the backside source/drain contact, forming a backside interlayer dielectric (ILD) layer over the backside source/drain contact and the hard mask layer, wherein the backside ILD layer electrically isolates the backside source/drain contact from adjacent structures.

5. A method for forming a semiconductor device structure, comprising:
    forming a source/drain feature within a region defined by a first side of a substrate, a first fin structure, and a second fin structure;
    forming a contact etch stop layer (CESL) on the source/drain feature;
    forming a first interlayer dielectric (ILD) layer on the CESL;
    removing the first ILD layer and a portion of the CESL to expose the source/drain feature;
    forming a first silicide layer on a first side of the source/drain feature, wherein the first silicide layer has a first thickness;
    forming a first source/drain contact over the first silicide layer;
    forming a back-end-of-line (BEOL) interconnect structure over the first source/drain contact;
    forming a contact opening extending from a second side of the substrate to the first side of the substrate to expose a second side of the source/drain feature; and
    after forming the contact opening, forming a second silicide layer on the second side of the source/drain feature, wherein the second silicide layer has a second thickness less than the first thickness; and
    forming a second source/drain contact in the contact opening.

6. The method of claim 5, wherein the source/drain feature comprises:
    a first epitaxial layer;
    a second epitaxial layer in contact with the first epitaxial layer; and
    a third epitaxial layer having sidewalls surrounded by and in contact with the second epitaxial layer.

7. The method of claim 5, wherein the second silicide layer is in further contact with the second epitaxial layer and the third epitaxial layer.

8. The method of claim 5, further comprising:
    after forming the second silicide layer, forming a metal capping layer on the second silicide layer.

9. The method of claim 5, further comprising:
    after forming the second source/drain contact, forming a second ILD layer over the second source/drain contact; and
    forming a conductive feature in the second ILD layer, wherein the conductive feature is in electrical connection with a power supply.

10. The method of claim 9, wherein each first and second fin structure comprises a plurality of first semiconductor layers and a plurality of second semiconductor layers alternatingly arranged.

11. The method of claim 10, further comprising:
after forming a first ILD layer on the CESL;
removing the plurality of second semiconductor layers in the first and second fin structures to expose portions of the plurality of first semiconductor layers; and
forming a gate electrode layer to surround the exposed portions of the plurality of first semiconductor layers in the first and second fin structures.

12. The method of claim 5, further comprising:
after forming the contact opening, depositing a barrier layer on sidewalls of the contact opening before forming the second source/drain contact, wherein the barrier layer is in contact with the substrate and the source/drain feature.

13. A method for forming a semiconductor device structure, comprising:
forming a fin structure from a substrate, wherein the fin structure comprises a plurality of first semiconductor layers and a plurality of second semiconductor layers alternatingly arranged;
forming a source/drain feature over a first side of the substrate, wherein the source/drain feature comprises:
a first epitaxial layer in contact with the first side of the substrate and a sidewall of at least one of the plurality of first semiconductor layer;
a second epitaxial layer in contact with the first epitaxial layer; and
a third epitaxial layer having sidewalls surrounded by and in contact with the second epitaxial layer;
removing the plurality of second semiconductor layers;
forming a gate electrode layer to surround a portion of each of the plurality of first semiconductor layers;
forming a first silicide layer on a first side of the source/drain feature, wherein the first silicide layer is in contact with the second and third epitaxial layers;
forming a first source/drain contact over the first silicide layer;
removing a portion of the substrate to expose a second side of the source/drain feature;
forming a second silicide layer on the second side of the source/drain feature; and
forming a second source/drain contact over the second silicide layer.

14. The method of claim 13, wherein the second silicide layer is formed to contact a portion of the first, second, and third epitaxial layers.

15. The method of claim 14, wherein the first silicide layer has a first thickness and the second silicide layer has a second thickness different than the first thickness.

16. The method of claim 15, wherein the second thickness is greater than the first thickness.

17. The method of claim 15, wherein the first silicide layer and the second silicide layer comprise the same material.

18. The method of claim 13, wherein the second source/drain contact is in electrical connection with a power supply.

19. The method of claim 13, wherein the first silicide layer is formed so that a portion contacting the third epitaxial layer has a first width, and a portion contacting the second epitaxial layer has a second width less than the first width.

20. The method of claim 19, wherein the first epitaxial layer is undoped, and wherein the second epitaxial layer has a first dopant concentration and the third epitaxial layer has a second dopant concentration greater than the first dopant concentration.

* * * * *